(12) United States Patent
Jeng et al.

(10) Patent No.: US 12,218,095 B2
(45) Date of Patent: Feb. 4, 2025

(54) CHIP PACKAGE STRUCTURE HAVING MOLDING LAYER

(71) Applicant: Taiwan Semiconductor Manufacturing Company, Ltd., Hsinchu (TW)

(72) Inventors: Shin-Puu Jeng, Hsinchu (TW); Shuo-Mao Chen, New Taipei (TW); Feng-Cheng Hsu, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/361,196

(22) Filed: Jul. 28, 2023

(65) Prior Publication Data

US 2024/0006367 A1 Jan. 4, 2024

Related U.S. Application Data

(60) Continuation of application No. 17/554,475, filed on Dec. 17, 2021, now Pat. No. 11,791,301, which is a (Continued)

(51) Int. Cl.
*H01L 23/00* (2006.01)
*H01L 21/56* (2006.01)
(Continued)

(52) U.S. Cl.
CPC .............. *H01L 24/25* (2013.01); *H01L 21/56* (2013.01); *H01L 21/568* (2013.01);
(Continued)

(58) Field of Classification Search
CPC ......... H01L 24/25; H01L 24/19; H01L 24/20; H01L 24/24; H01L 24/27; H01L 24/32;
(Continued)

(56) References Cited

U.S. PATENT DOCUMENTS 8,039,304 B2 10/2011 Pagaila
9,000,584 B2 4/2015 Lin et al.
(Continued)

FOREIGN PATENT DOCUMENTS

CN 105514087 A 4/2016
CN 105990291 A 10/2016
(Continued)

OTHER PUBLICATIONS

Chinese language office action dated Mar. 17, 2021, issued in application No. CN 201711210160.9.
(Continued)

*Primary Examiner* — Nathan W Ha
(74) *Attorney, Agent, or Firm* — McClure, Qualey & Rodack, LLP

(57) ABSTRACT

A chip package structure is provided. The chip package structure includes a first redistribution structure having a first surface and a second surface opposite to the first surface. The chip package structure includes a first chip over the first surface. The chip package structure includes a first conductive pillar over the first surface and adjacent to the first chip. The chip package structure includes a second chip over the second surface. The chip package structure includes a second conductive pillar over the second surface and adjacent to the second chip. The chip package structure includes a first molding layer over the first surface and surrounding the first chip. The chip package structure includes a second molding layer over the second surface and surrounding the second chip.

20 Claims, 28 Drawing Sheets

Related U.S. Application Data continuation of application No. 16/750,071, filed on Jan. 23, 2020, now Pat. No. 11,239,194, which is a continuation of application No. 16/403,897, filed on May 6, 2019, now Pat. No. 10,546,830, which is a division of application No. 15/708,456, filed on Sep. 19, 2017, now Pat. No. 10,283,474.

(60) Provisional application No. 62/527,161, filed on Jun. 30, 2017.

(51) Int. Cl.
  *H01L 21/683* (2006.01)
  *H01L 23/31* (2006.01)
  *H01L 25/00* (2006.01)
  *H01L 25/065* (2023.01)
  *H01L 25/10* (2006.01)
  *H01L 21/78* (2006.01)
  *H01L 23/29* (2006.01)

(52) U.S. Cl.
  CPC ...... *H01L 21/6835* (2013.01); *H01L 23/3128* (2013.01); *H01L 23/3135* (2013.01); *H01L 24/19* (2013.01); *H01L 24/20* (2013.01); *H01L 24/24* (2013.01); *H01L 24/27* (2013.01); *H01L 24/32* (2013.01); *H01L 25/0652* (2013.01); *H01L 25/0655* (2013.01); *H01L 25/105* (2013.01); *H01L 25/50* (2013.01); *H01L 21/565* (2013.01); *H01L 21/78* (2013.01); *H01L 23/29* (2013.01); *H01L 23/3114* (2013.01); *H01L 24/03* (2013.01); *H01L 24/05* (2013.01); *H01L 24/06* (2013.01); *H01L 24/09* (2013.01); *H01L 24/13* (2013.01); *H01L 24/14* (2013.01); *H01L 24/16* (2013.01); *H01L 24/17* (2013.01); *H01L 24/73* (2013.01); *H01L 24/81* (2013.01); *H01L 2221/68318* (2013.01); *H01L 2221/68345* (2013.01); *H01L 2221/68359* (2013.01); *H01L 2221/68372* (2013.01); *H01L 2221/68381* (2013.01); *H01L 2224/0401* (2013.01); *H01L 2224/05124* (2013.01); *H01L 2224/05147* (2013.01); *H01L 2224/05184* (2013.01); *H01L 2224/13082* (2013.01); *H01L 2224/13111* (2013.01); *H01L 2224/13124* (2013.01); *H01L 2224/13139* (2013.01); *H01L 2224/13147* (2013.01); *H01L 2224/13184* (2013.01); *H01L 2224/16225* (2013.01); *H01L 2224/215* (2013.01); *H01L 2224/32225* (2013.01); *H01L 2224/73204* (2013.01); *H01L 2224/81193* (2013.01); *H01L 2224/81801* (2013.01); *H01L 2225/1047* (2013.01); *H01L 2225/1058* (2013.01); *H01L 2924/1203* (2013.01); *H01L 2924/1304* (2013.01); *H01L 2924/1431* (2013.01); *H01L 2924/15192* (2013.01); *H01L 2924/15311* (2013.01); *H01L 2924/181* (2013.01)

(58) Field of Classification Search
  CPC ... H01L 21/56; H01L 21/568; H01L 21/6835; H01L 23/3128; H01L 23/3135
  See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,607,967 B1 * | 3/2017 | Shih | H01L 21/6835 |
| 9,627,365 B1 | 4/2017 | Yu et al. | |
| 9,859,253 B1 * | 1/2018 | Jayaraman | H01L 21/563 |
| 9,911,667 B2 | 3/2018 | Chen | |
| 10,134,677 B1 | 11/2018 | Chang et al. | |
| 10,546,830 B2 | 1/2020 | Jeng et al. | |
| 11,791,301 B2 * | 10/2023 | Jeng | H01L 25/105 257/737 |
| 2007/0030628 A1 | 2/2007 | Yamamoto et al. | |
| 2007/0076392 A1 | 4/2007 | Urashima et al. | |
| 2007/0126122 A1 | 6/2007 | Bauer et al. | |
| 2007/0235850 A1 | 10/2007 | Gerber et al. | |
| 2009/0051024 A1 | 2/2009 | Chia | |
| 2010/0133704 A1 | 6/2010 | Marimuthu et al. | |
| 2011/0037169 A1 | 2/2011 | Pagaila | |
| 2011/0285007 A1 | 11/2011 | Chi et al. | |
| 2012/0018881 A1 * | 1/2012 | Pagaila | H01L 23/49827 257/737 |
| 2012/0056312 A1 | 3/2012 | Pagaila et al. | |
| 2012/0119379 A1 | 5/2012 | Koizumi et al. | |
| 2013/0241080 A1 * | 9/2013 | Pagaila | H01L 23/49827 257/774 |
| 2014/0091471 A1 | 4/2014 | Chen et al. | |
| 2014/0217604 A1 | 8/2014 | Chou et al. | |
| 2014/0217610 A1 * | 8/2014 | Jeng | H01L 21/4857 257/774 |
| 2014/0299999 A1 | 10/2014 | Hu et al. | |
| 2014/0367850 A1 | 12/2014 | Wang | |
| 2015/0357274 A1 * | 12/2015 | Choi | H01L 23/3128 257/737 |
| 2016/0079205 A1 | 3/2016 | Lin et al. | |
| 2016/0093572 A1 | 3/2016 | Chen | |
| 2016/0233196 A1 * | 8/2016 | Kim | H01L 21/4867 |
| 2016/0293588 A1 | 10/2016 | Lin et al. | |
| 2016/0300815 A1 * | 10/2016 | Kim | H01L 24/94 |
| 2016/0315071 A1 | 10/2016 | Zhai et al. | |
| 2016/0329262 A1 | 11/2016 | Hsiao et al. | |
| 2017/0117251 A1 * | 4/2017 | Khan | H01L 23/50 |
| 2017/0141088 A1 | 5/2017 | Zhai et al. | |
| 2017/0207204 A1 * | 7/2017 | Lin | H01L 25/105 |
| 2017/0294422 A1 * | 10/2017 | Solimando | H01L 23/3672 |
| 2018/0033770 A1 | 2/2018 | Hsu et al. | |
| 2018/0040585 A1 * | 2/2018 | Yu | H01L 24/17 |

FOREIGN PATENT DOCUMENTS

| | | |
|---|---|---|
| WO | 2016/164119 A1 | 10/2016 |
| WO | 2016/171805 A1 | 10/2016 |

OTHER PUBLICATIONS

Chinese language office action dated Nov. 4, 2020, issued in application No. TW 106142530.

* cited by examiner

CHIP PACKAGE STRUCTURE HAVING MOLDING LAYER

CROSS REFERENCE

This application is a Continuation of U.S. application Ser. No. 17/554,475, filed on Dec. 17, 2021, which is a Continuation of U.S. application Ser. No. 16/750,071, filed on Jan. 23, 2020, which is a Continuation of U.S. application Ser. No. 16/403,897, filed on May 6, 2019, which is a Divisional application of U.S. patent application Ser. No. 15/708,456, filed on Sep. 19, 2017, which claims the benefit of provisional Application No. 62/527,161, filed on Jun. 30, 2017, the entirety of which is incorporated by reference herein.

BACKGROUND

This application is a Continuation of U.S. application Ser. No. 17/554,475, filed on Dec. 17, 2021, now U.S. Pat. No. 11,791,301, which is a Continuation of U.S. application Ser. No. 16/750,071, filed on Jan. 23, 2020, now U.S. Pat. No. 11,239,194, which is a Continuation of U.S. application Ser. No. 16/403,897, filed on May 6, 2019, now U.S. Pat. No. 10,546,830, which is a Divisional application of U.S. patent application Ser. No. 15/708,456, filed on Sep. 19, 2017, now U.S. Pat. No. 10,283,474, which claims the benefit of provisional Application No. 62/527,161, filed on Jun. 30, 2017, the entirety of which is incorporated by reference herein.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
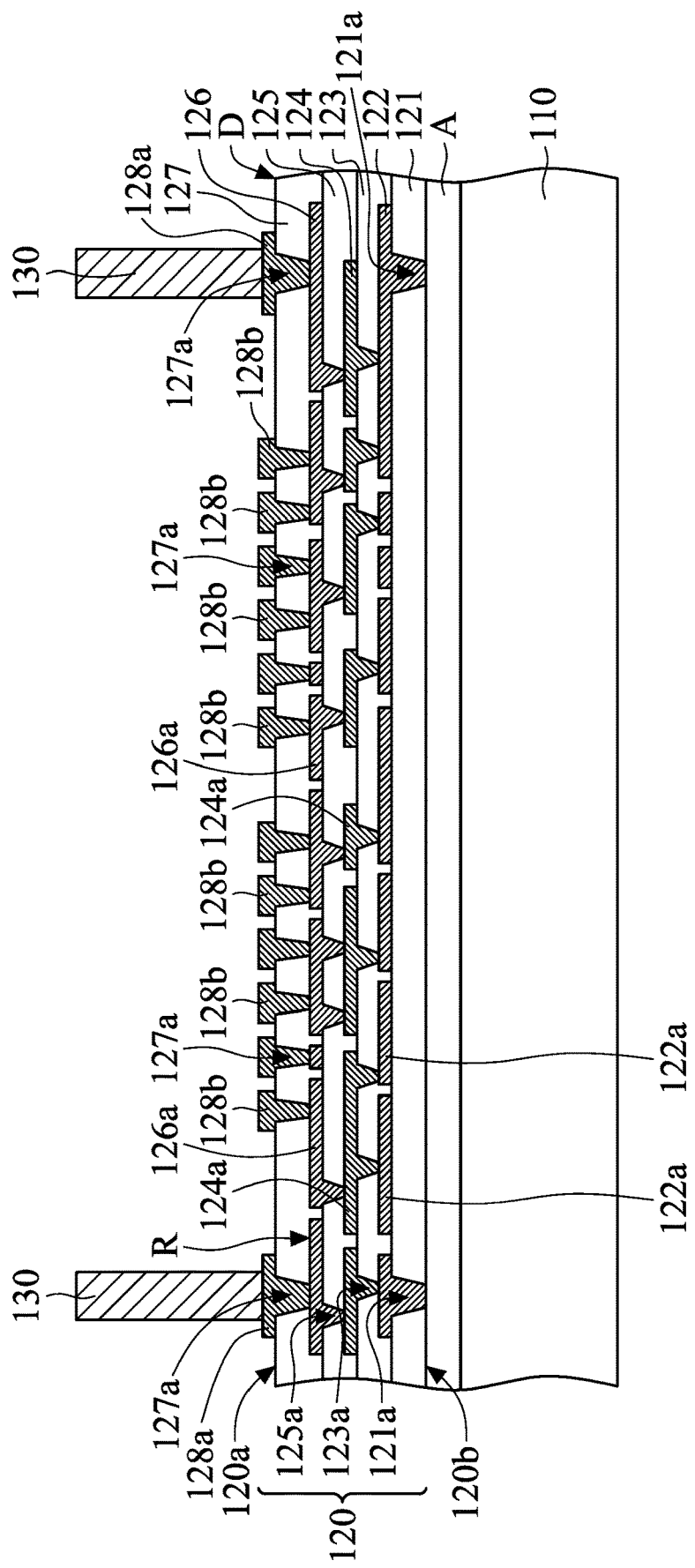
FIGS. 1A-1M are cross-sectional views of various stages of a process for forming a chip package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1M are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, metal, a combination thereof, and/or the like, in accordance with some embodiments. The carrier substrate 110 includes a metal frame, in accordance with some embodiments.

As shown in FIG. 1A, an adhesive layer A is formed over the carrier substrate 110, in accordance with some embodiments. The adhesive layer A is in direct contact with the carrier substrate 110, in accordance with some embodiments. The adhesive layer A is conformally formed on the carrier substrate 110, in accordance with some embodiments. The adhesive layer A is made of an insulating material, such as a polymer material, in accordance with some embodiments. The adhesive layer A is formed using a coating process or another suitable process.

As shown in FIG. 1A, a dielectric layer 121 is formed over the adhesive layer A, in accordance with some embodiments. The dielectric layer 121 is in direct contact with the adhesive layer A, in accordance with some embodiments. The dielectric layer 121 is conformally formed on the adhesive layer A, in accordance with some embodiments. The dielectric layer 121 is made of an insulating material such as a polymer material (e.g., polybenzoxazole or polyimide), nitride (e.g., silicon nitride), oxide (e.g., silicon oxide), silicon oxynitride, or the like, in accordance with some embodiments. The dielectric layer 121 is formed using a coating process, a deposition process, or another suitable process.

As shown in FIG. 1A, a portion of the dielectric layer 121 is removed to form openings 121a in the dielectric layer 121, in accordance with some embodiments. The openings 121a expose a portion of the adhesive layer A, in accordance with some embodiments. In some embodiments, the dielectric layer 121 is made of a photosensitive material, and the removal of the dielectric layer 121 includes performing a photolithography process. In some embodiments, the removal of the dielectric layer 121 includes performing a photolithography process and an etching process.

As shown in FIG. 1A, a wiring layer 122 is formed over the dielectric layer 121, in accordance with some embodiments. The wiring layer 122 extends into the openings 121a, in accordance with some embodiments. The wiring layer 122 is in direct contact with the adhesive layer A, in accordance with some embodiments. In some embodiments, the openings 121a are filled with the wiring layer 122. The wiring layer 122 includes conductive lines 122a, in accordance with some embodiments. The wiring layer 122 is made of a conductive material, such as metal (e.g. copper, aluminum, or tungsten), in accordance with some embodiments.

As shown in FIG. 1A, a dielectric layer 123 is formed over the dielectric layer 121 and the wiring layer 122, in accordance with some embodiments. The dielectric layer 123 is made of an insulating material such as a polymer material (e.g., polybenzoxazole or polyimide), nitride (e.g., silicon nitride), oxide (e.g., silicon oxide), silicon oxynitride, or the like, in accordance with some embodiments. The dielectric layer 123 is formed using a coating process, a deposition process, or another suitable process.

As shown in FIG. 1A, a portion of the dielectric layer 123 is removed to form openings 123a in the dielectric layer 123, in accordance with some embodiments. The openings 123a expose a portion of the wiring layer 122, in accordance with some embodiments. In some embodiments, the dielectric layer 123 is made of a photosensitive material, and the removal of the dielectric layer 123 includes performing a photolithography process. In some embodiments, the removal of the dielectric layer 123 includes performing a photolithography process and an etching process.

As shown in FIG. 1A, a wiring layer 124 is formed over the dielectric layer 123, in accordance with some embodiments. The wiring layer 124 extends into the openings 123a to be electrically connected to the wiring layer 122, in accordance with some embodiments. The wiring layer 124 is in direct contact with the wiring layer 122, in accordance with some embodiments.

In some embodiments, the openings 123a are filled with the wiring layer 124. The wiring layer 124 includes conductive lines 124a, in accordance with some embodiments. The wiring layer 124 is made of a conductive material, such as metal (e.g. copper, aluminum, or tungsten), in accordance with some embodiments.

As shown in FIG. 1A, a dielectric layer 125 is formed over the dielectric layer 123 and the wiring layer 124, in accordance with some embodiments. The dielectric layer 125 is made of an insulating material such as a polymer material (e.g., polybenzoxazole (PBO) or polyimide), nitride (e.g., silicon nitride), oxide (e.g., silicon oxide), silicon oxynitride, or the like, in accordance with some embodiments. The dielectric layer 125 is formed using a coating process, a deposition process, or another suitable process.

As shown in FIG. 1A, a portion of the dielectric layer 125 is removed to form openings 125a in the dielectric layer 125, in accordance with some embodiments. The openings 125a expose a portion of the wiring layer 124, in accordance with some embodiments. In some embodiments, the dielectric layer 125 is made of a photosensitive material, and the removal of the dielectric layer 125 includes performing a photolithography process. In some embodiments, the removal of the dielectric layer 125 includes performing a photolithography process and an etching process.

As shown in FIG. 1A, a wiring layer 126 is formed over the dielectric layer 125, in accordance with some embodiments. The wiring layer 126 extends into the openings 125a to be electrically connected to the wiring layer 124, in accordance with some embodiments. The wiring layer 126 is in direct contact with the wiring layer 124, in accordance with some embodiments.

In some embodiments, the openings 125a are filled with the wiring layer 126. The wiring layer 126 includes conductive lines 126a, in accordance with some embodiments. The wiring layer 126 is made of a conductive material, such as metal (e.g. copper, aluminum, or tungsten), in accordance with some embodiments.

As shown in FIG. 1A, a dielectric layer 127 is formed over the dielectric layer 125 and the wiring layer 126, in accordance with some embodiments. The dielectric layer 127 is made of an insulating material such as a polymer material (e.g., polybenzoxazole or polyimide), nitride (e.g., silicon nitride), oxide (e.g., silicon oxide), silicon oxynitride, or the like, in accordance with some embodiments. The dielectric layer 127 is formed using a coating process, a deposition process, or another suitable process.

As shown in FIG. 1A, a portion of the dielectric layer 127 is removed to form openings 127a in the dielectric layer 127, in accordance with some embodiments. The openings 127a expose a portion of the wiring layer 126, in accordance with some embodiments. In some embodiments, the dielectric layer 127 is made of a photosensitive material, and the removal of the dielectric layer 127 includes performing a photolithography process. In some embodiments, the removal of the dielectric layer 127 includes performing a photolithography process and an etching process.

As shown in FIG. 1A, conductive pads 128a and 128b are formed over the dielectric layer 127, in accordance with some embodiments. The conductive pads 128a surround the conductive pads 128b, in accordance with some embodiments. The conductive pads 128a and 128b extend into the openings 127a to be electrically connected to the wiring layer 126, in accordance with some embodiments.

The conductive pads 128a and 128b are in direct contact with the wiring layer 126, in accordance with some embodiments. The conductive pads 128a and 128b are made of a conductive material, such as metal (e.g. copper, aluminum, or tungsten), in accordance with some embodiments. In some other embodiments (not shown), the conductive pads 128a are not formed.

In some embodiments, all of the dielectric layers 121, 123, 125, and 127 are continuous dielectric layers. The dielectric layers 121, 123, 125, and 127 together form a dielectric structure D, in accordance with some embodiments. The wiring layers 122, 124, and 126 together form a wiring structure R, in accordance with some embodiments.

The wiring structure R is formed in the dielectric structure D, in accordance with some embodiments. The dielectric structure D, the wiring structure R, and the conductive pads 128a and 128b together form a redistribution structure 120, in accordance with some embodiments. The redistribution structure 120 has surfaces 120a and 120b, in accordance with some embodiments. The surface 120b is opposite to the surface 120a, in accordance with some embodiments. The surface 120b faces the carrier substrate 110, in accordance with some embodiments.

As shown in FIG. 1A, conductive pillars 130 are formed over the conductive pads 128a, in accordance with some embodiments. The conductive pillars 130 are electrically connected to the conductive pads 128a and the wiring structure R, in accordance with some embodiments. The conductive pillars 130 are over the surface 120a of the redistribution structure 120, in accordance with some embodiments.

The conductive pillars 130 are formed using an electroplating process or another suitable process. The conductive pillars 130 are made of a conductive material, such as metal (e.g., copper, aluminum, or tungsten) or an alloy thereof, in accordance with some embodiments.

Figure 1B:
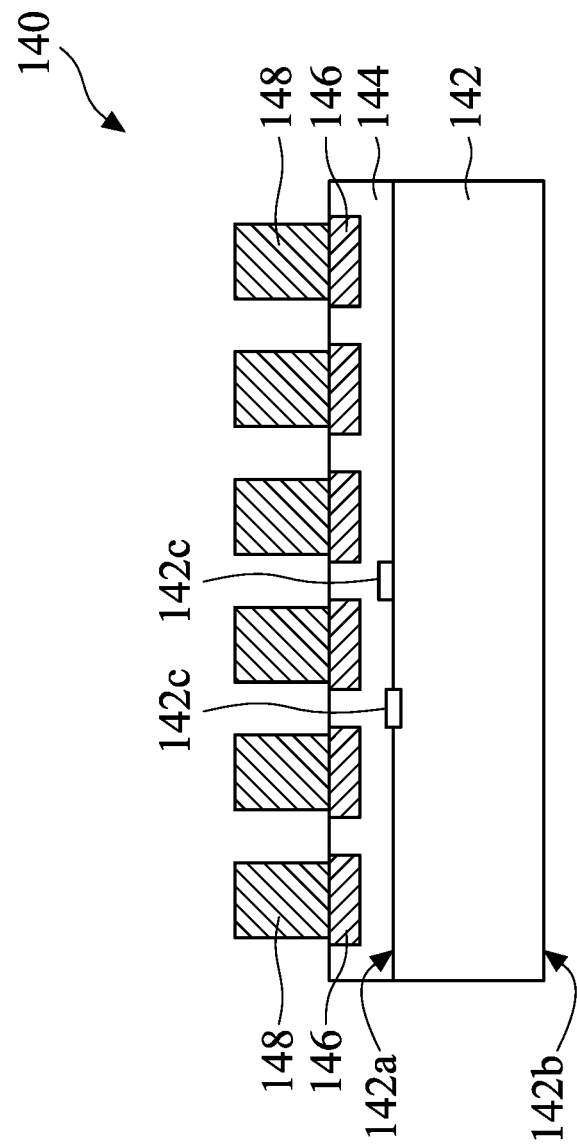

As shown in FIG. 1B, chips 140 are provided, in accordance with some embodiments. For the sake of simplicity, FIG. 1B only shows one of the chips 140, in accordance with some embodiments. Each of the chips 140 includes a substrate 142, electronic elements 142c, a dielectric layer 144, bonding pads 146, and conductive structures 148, in accordance with some embodiments.

The substrate 142 is also referred to as a semiconductor substrate, a system-on-chip (SoC), a logic die, or a memory die, in accordance with some embodiments. In some embodiments, the substrate 142 is made of at least an elementary semiconductor material including silicon or germanium in a single crystal, polycrystal, or amorphous structure.

In some other embodiments, the substrate 142 is made of a compound phosphide, indium arsenide, an alloy semiconductor, such as SiGe, or GaAsP, or a combination thereof. The substrate 142 may also include multi-layer semiconductors, semiconductor on insulator (SOI) (such as silicon on insulator or germanium on insulator), or a combination thereof.

The substrate 142 has a front surface 142a and a back surface 142b opposite to the front surface 142a, in accordance with some embodiments. In some embodiments, the electronic elements 142c are formed on the front surface 142a or in the substrate 142 adjacent to the front surface 142a. The electronic elements 142c include active elements (e.g. transistors, diodes, or the like) and/or passive elements (e.g. resistors, capacitors, inductors, or the like).

In some embodiments, active elements (e.g. transistors, diodes, or the like) and passive elements (e.g. resistors, capacitors, inductors, or the like) are not formed on the back surface 142b or in the substrate 142 adjacent to the back surface 142b. That is, there is no active element and no passive element formed directly on the back surface 142b or in the substrate 142 adjacent to the back surface 142b. In some other embodiments, active elements (e.g. transistors, diodes, or the like) and passive elements (e.g. resistors, capacitors, inductors, or the like) are formed on the back surface 142b or in the substrate 142 adjacent to the back surface 142b.

As shown in FIG. 1B, in each of the chips 140, the dielectric layer 144 is formed over the substrate 142, in accordance with some embodiments. The bonding pads 146 are formed in the dielectric layer 144, in accordance with some embodiments. The bonding pads 146 are electrically connected to the electronic elements 142c formed in/over the substrate 142, in accordance with some embodiments. The bonding pads 146 is made of a conductive material, such as metal (e.g., copper or aluminum), in accordance with some embodiments.

As shown in FIG. 1B, the conductive structures 148 are formed over the respective bonding pads 146, in accordance with some embodiments. The conductive structures 148 are electrically connected to the bonding pads 146 thereunder, in accordance with some embodiments. The conductive structures 148 include conductive pillars, in accordance with some embodiments. The conductive structures 148 are also referred to as conductive bumps, in accordance with some embodiments. The conductive structures 148 are made of a conductive material, such as metal (e.g. copper, aluminum, or tungsten), in accordance with some embodiments.

Figure 1C:
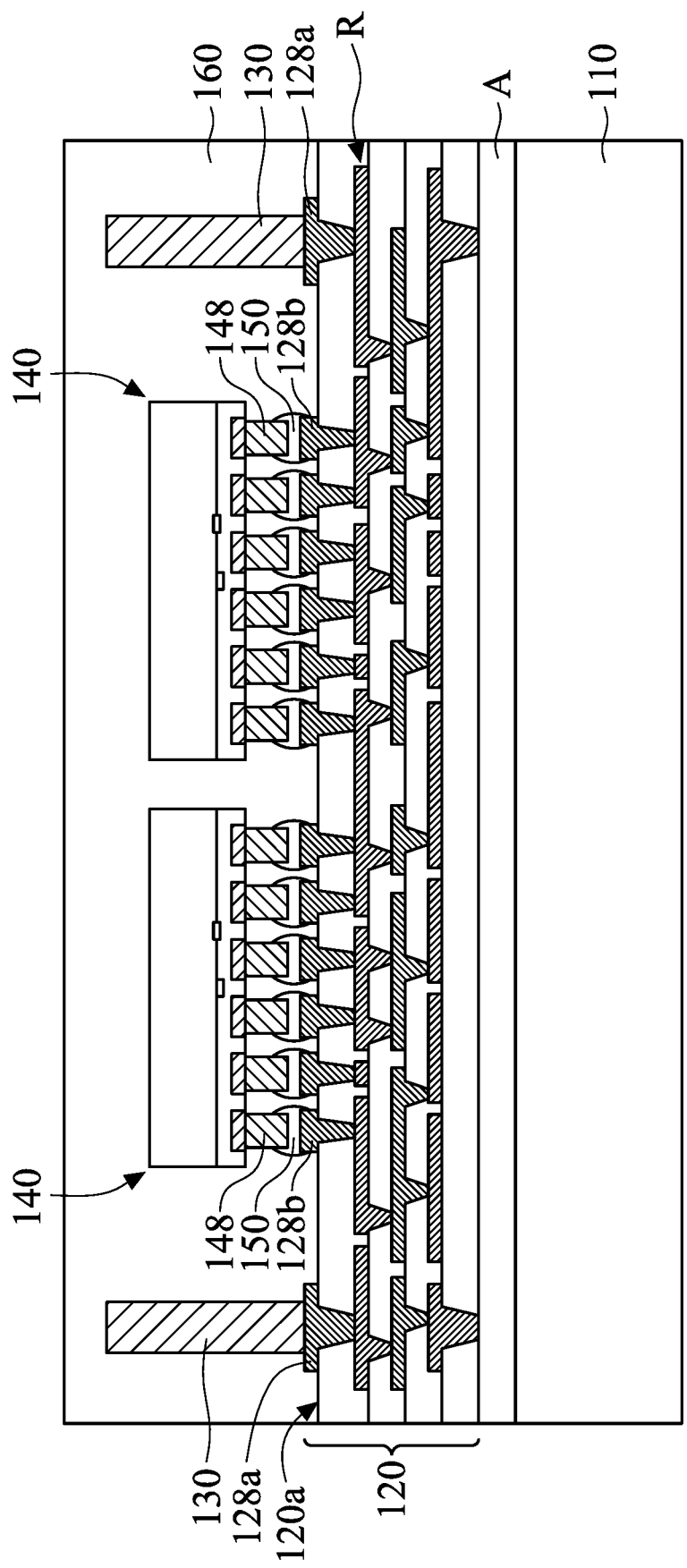

As shown in FIG. 1C, the chips 140 are bonded to the conductive pads 128b through conductive bumps 150, in accordance with some embodiments. The conductive bumps 150 are between the conductive structures 148 of the chips 140 and the conductive pads 128b, in accordance with some embodiments.

The chips 140 are electrically connected to the conductive pads 128b and the wiring structure R through the conductive bumps 150 therebetween, in accordance with some embodiments. The chips 140 and the conductive bumps 150 are positioned over the surface 120a of the redistribution structure 120, in accordance with some embodiments. The conductive bumps 150 are made of a solder material, such as Sn and Ag or another suitable conductive material, in accordance with some embodiments. The conductive bumps 150 are solder balls, in accordance with some embodiments.

As shown in FIG. 1C, a molding layer 160 is formed over the surface 120a to cover and surround the chips 140, the conductive bumps 150, and the conductive pillars 130, in accordance with some embodiments. The molding layer 160 is made of a polymer material or another suitable insulating material. The molding layer 160 is in direct contact with the chips 140, the conductive bumps 150, and the conductive pillars 130, in accordance with some embodiments.

Figure 1D:
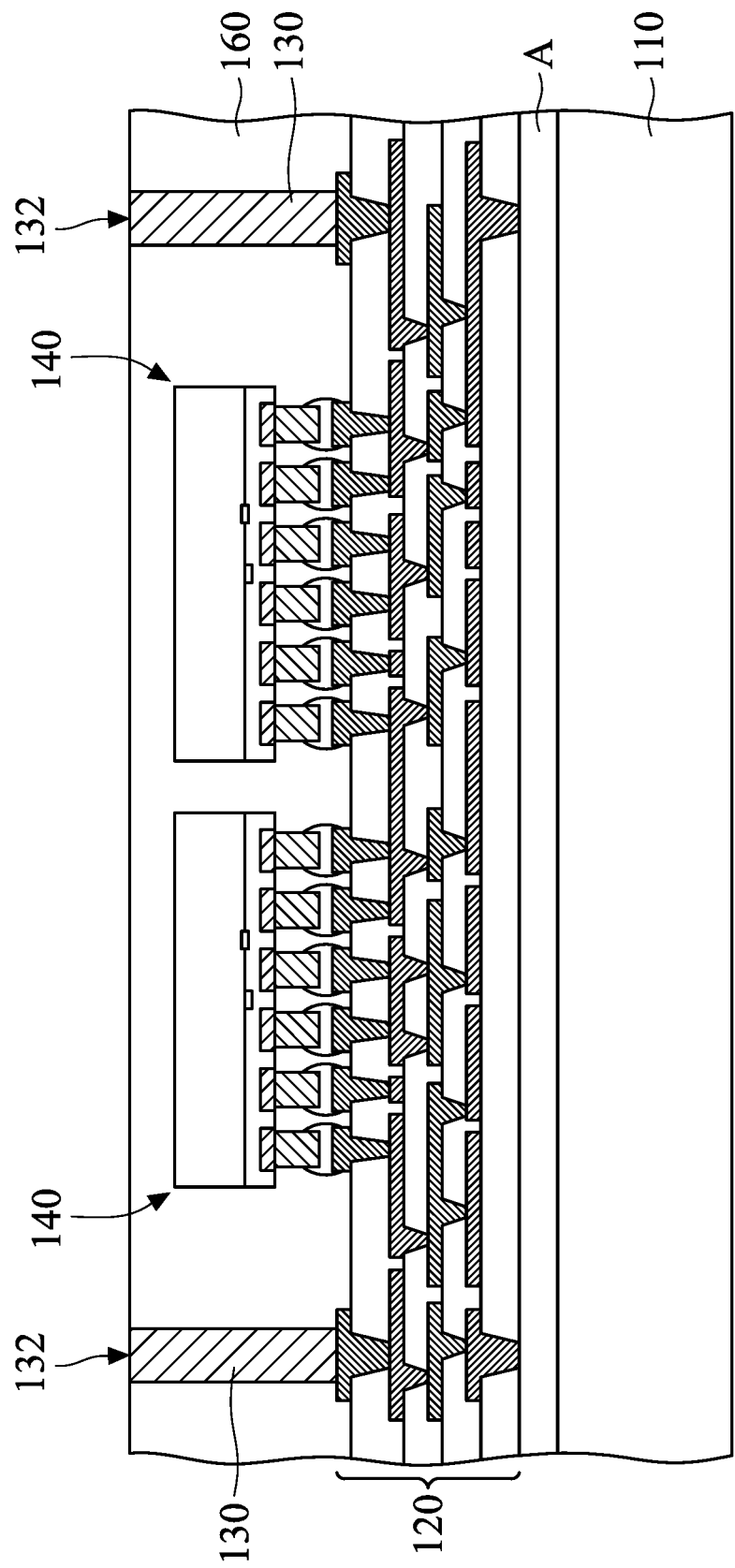

As shown in FIG. 1D, a top portion of the molding layer 160 is removed to expose top surfaces 132 of the conductive pillars 130, in accordance with some embodiments. In some embodiments (not shown), after the removal process, top surfaces of the chips 140 are exposed as well. The removal process includes a planarization process, such as a chemical mechanical process, in accordance with some embodiments.

Figure 1E:
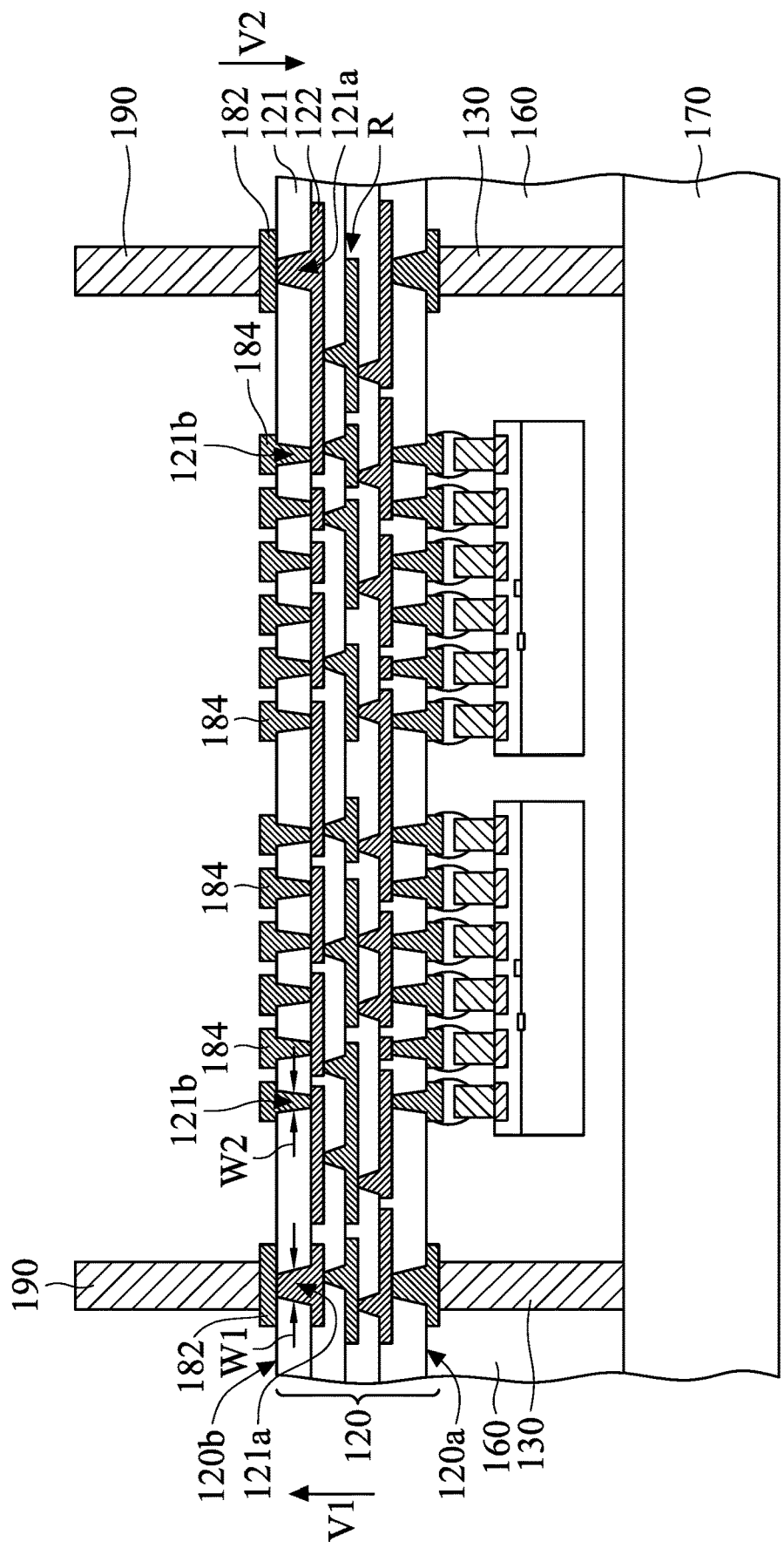

As shown in FIG. 1E, the molding layer 160 is bonded to a carrier substrate 170 and flipped upside down, in accordance with some embodiments. The carrier substrate 170 is configured to provide temporary mechanical and structural support during subsequent processing steps, in accordance with some embodiments.

The carrier substrate 170 includes glass, silicon oxide, aluminum oxide, metal, a combination thereof, and/or the like, in accordance with some embodiments. The carrier substrate 170 includes a metal frame, in accordance with some embodiments. As shown in FIG. 1E, the carrier substrate 110 and the adhesive layer A are removed, in accordance with some embodiments.

As shown in FIG. 1E, a portion of the dielectric layer 121 is removed to form openings 121b in the dielectric layer 121, in accordance with some embodiments. The openings 121b expose a portion of the wiring layer 122, in accordance with some embodiments. The removal process of the portion of the dielectric layer 121 includes a photolithography process and an etching process, in accordance with some embodiments.

As shown in FIG. 1E, conductive pads 182 and 184 are formed over the dielectric layer 121 (or the surface 120b), in accordance with some embodiments. The conductive pads 182 are positioned over the wiring layer 122 in the openings 121a, in accordance with some embodiments. The conductive pads 182 are electrically connected to the wiring layer 122, in accordance with some embodiments. The conductive pads 182 are in direct contact with the wiring layer 122, in accordance with some embodiments.

The conductive pads 184 extend into the openings 121b, in accordance with some embodiments. The conductive pads 184 are electrically connected to the wiring layer 122, in accordance with some embodiments. The conductive pads 184 are in direct contact with the wiring layer 122, in accordance with some embodiments.

The wiring layer 122 in the openings 121a has a width W1 decreasing in a direction V1 toward the conductive pads 182 or the surface 120b, in accordance with some embodiments. The conductive pad 184 in the openings 121b has a width W2 decreasing in a direction V2 toward the wiring layer 122 or the surface 120a, in accordance with some embodiments. The direction V1 is opposite to the direction V2, in accordance with some embodiments.

As shown in FIG. 1E, conductive pillars 190 are formed over the conductive pad 182, in accordance with some embodiments. The conductive pillars 190 are electrically connected to the conductive pads 182 and the wiring structure R, in accordance with some embodiments. The conductive pillars 190 are over the surface 120b of the redistribution structure 120, in accordance with some embodiments.

The conductive pillars 190 are formed using an electroplating process or another suitable process. The conductive pillars 190 are made of a conductive material, such as metal (e.g., copper, aluminum, or tungsten) or an alloy thereof, in accordance with some embodiments.

Figure 1F:
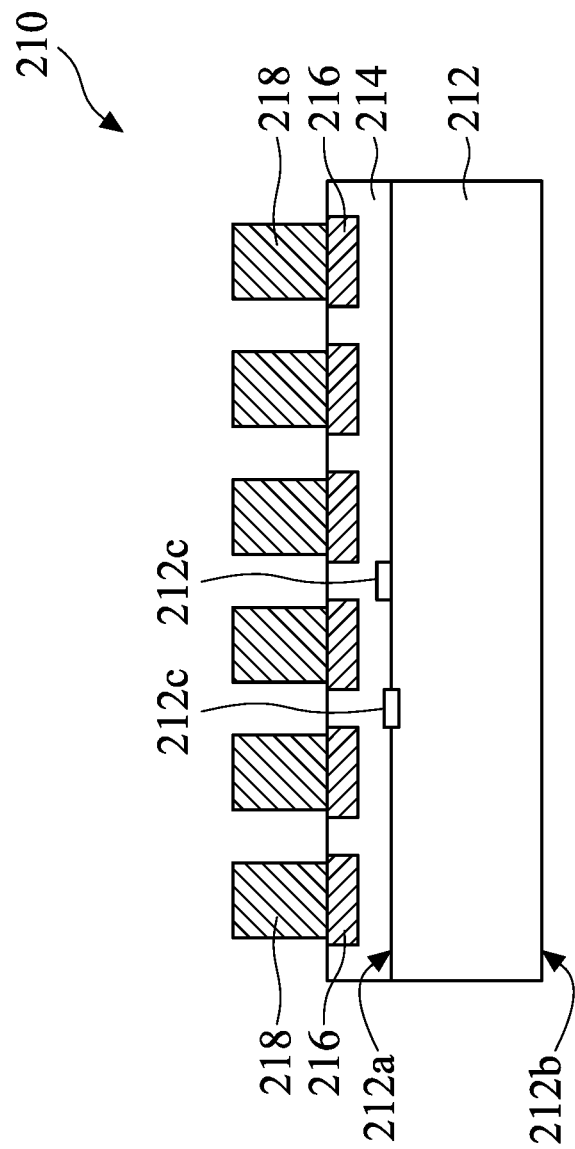

As shown in FIG. 1F, chips 210 are provided, in accordance with some embodiments. For the sake of simplicity, FIG. 1F only shows one of the chips 210, in accordance with some embodiments. Each of the chips 210 includes a substrate 212, electronic elements 212c, a dielectric layer 214, bonding pads 216, and conductive structures 218, in accordance with some embodiments.

The substrate 212 is also referred to as a semiconductor substrate, a system-on-chip (SoC), a logic die, or a memory die, in accordance with some embodiments. In some embodiments, the substrate 212 is made of at least an elementary semiconductor material including silicon or germanium in a single crystal, polycrystal, or amorphous structure.

In some other embodiments, the substrate 212 is made of a compound semiconductor, such as silicon carbide, gallium arsenide, gallium phosphide, indium phosphide, indium arsenide, an alloy semiconductor, such as SiGe, or GaAsP, or a combination thereof. The substrate 212 may also include multi-layer semiconductors, semiconductor on insulator (SOI) (such as silicon on insulator or germanium on insulator), or a combination thereof.

The substrate 212 has a front surface 212a and a back surface 212b opposite to the front surface 212a, in accordance with some embodiments. In some embodiments, electronic elements 212c are formed on the front surface 212a or in the substrate 212 adjacent to the front surface 212a. The electronic elements 212c include active elements (e.g. transistors, diodes, or the like) and/or passive elements (e.g. resistors, capacitors, inductors, or the like).

In some embodiments, active elements (e.g. transistors, diodes, or the like) and passive elements (e.g. resistors, capacitors, inductors, or the like) are not formed on the back surface 212b or in the substrate 212 adjacent to the back surface 212b. That is, there is no active element and no passive element formed directly on the back surface 212b or in the substrate 212 adjacent to the back surface 212b. In some other embodiments, active elements (e.g. transistors, diodes, or the like) and passive elements (e.g. resistors, capacitors, inductors, or the like) are formed on the back surface 212b or in the substrate 212 adjacent to the back surface 212b.

As shown in FIG. 1F, in each of the chips 210, the dielectric layer 214 is formed over the substrate 212, in accordance with some embodiments. The bonding pads 216 are formed in the dielectric layer 214, in accordance with some embodiments. The bonding pads 216 are electrically connected to the electronic elements 212c formed in/over the substrate 212, in accordance with some embodiments. The bonding pads 216 are made of a conductive material, such as metal (e.g., copper or aluminum), in accordance with some embodiments.

As shown in FIG. 1F, the conductive structures 218 are formed over the respective bonding pads 216, in accordance with some embodiments. The conductive structures 218 are electrically connected to the bonding pads 216 thereunder, in accordance with some embodiments. The conductive structures 218 include conductive pillars, in accordance with some embodiments. The conductive structures 218 are made of a conductive material, such as metal (e.g. copper, aluminum, or tungsten), in accordance with some embodiments.

Figure 1G:
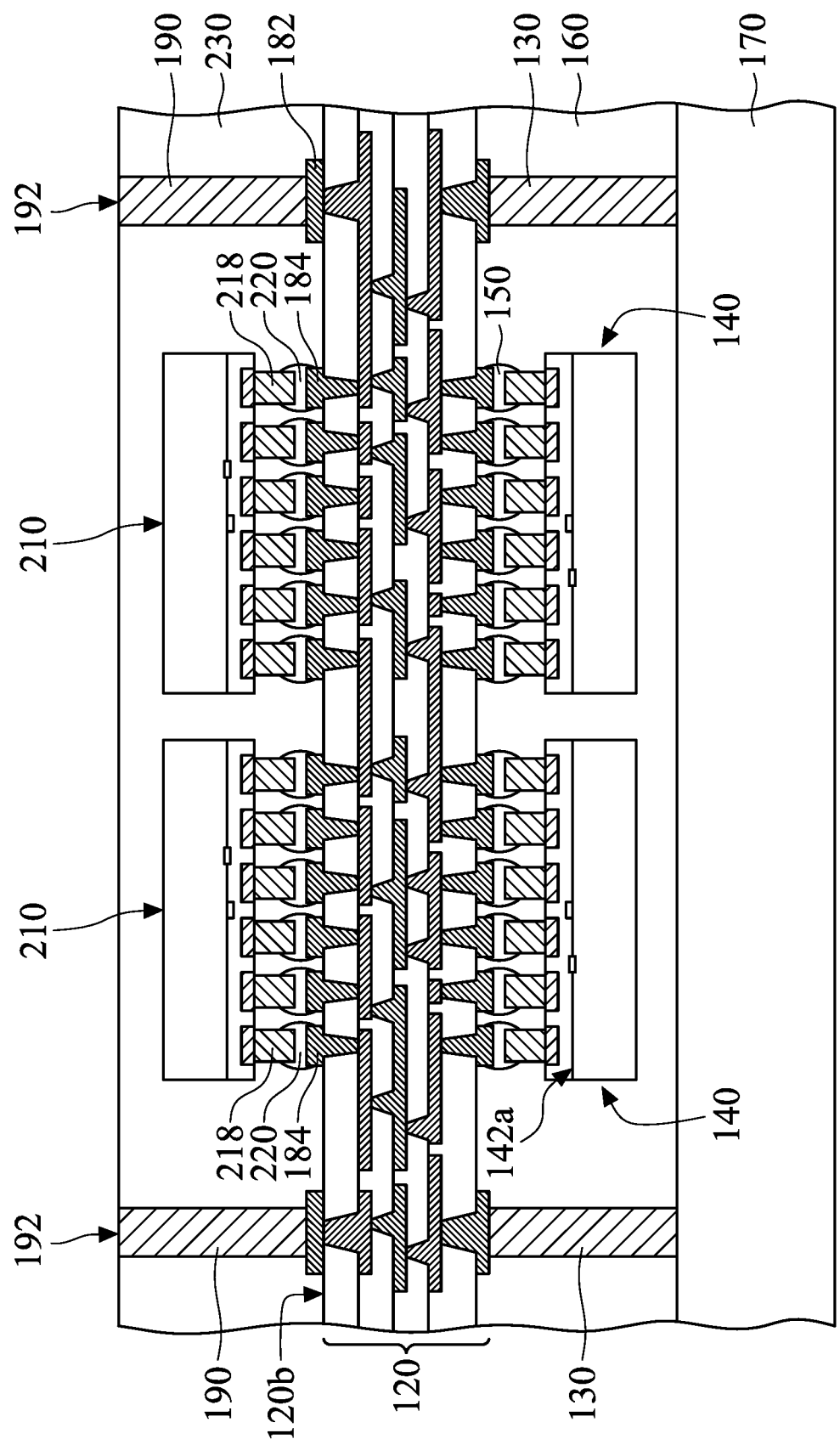

As shown in FIG. 1G, the chips 210 are bonded to the conductive pads 184 through conductive bumps 220, in accordance with some embodiments. The conductive bumps 220 are between the conductive structures 218 of the chips 210 and the conductive pads 184, in accordance with some embodiments.

The chips 210 are electrically connected to the conductive pads 184 and the wiring structure R through the conductive bumps 220 therebetween, in accordance with some embodiments. The chips 210 and the conductive bumps 220 are positioned over the surface 120b of the redistribution structure 120, in accordance with some embodiments. The conductive bumps 220 are made of a solder material, such as Sn and Ag or another suitable conductive material, in accordance with some embodiments. The conductive bumps 220 are solder balls, in accordance with some embodiments.

As shown in FIG. 1G, a molding layer 230 is formed over the surface 120b to cover and surround the chips 210, the conductive bumps 220, and the conductive pillars 190, in accordance with some embodiments. The molding layer 230 is made of a polymer material or another suitable insulating material. The molding layer 230 is in direct contact with the chips 210, the conductive bumps 220, and the conductive pillars 190, in accordance with some embodiments.

In some embodiments, a top portion of the molding layer 230 is removed to expose top surfaces 192 of the conductive pillars 190. In some embodiments (not shown), after the removal process, top surfaces of the chips 210 are exposed as well. The removal process includes a planarization process, such as a chemical mechanical process, in accordance with some embodiments.

Figure 1H:
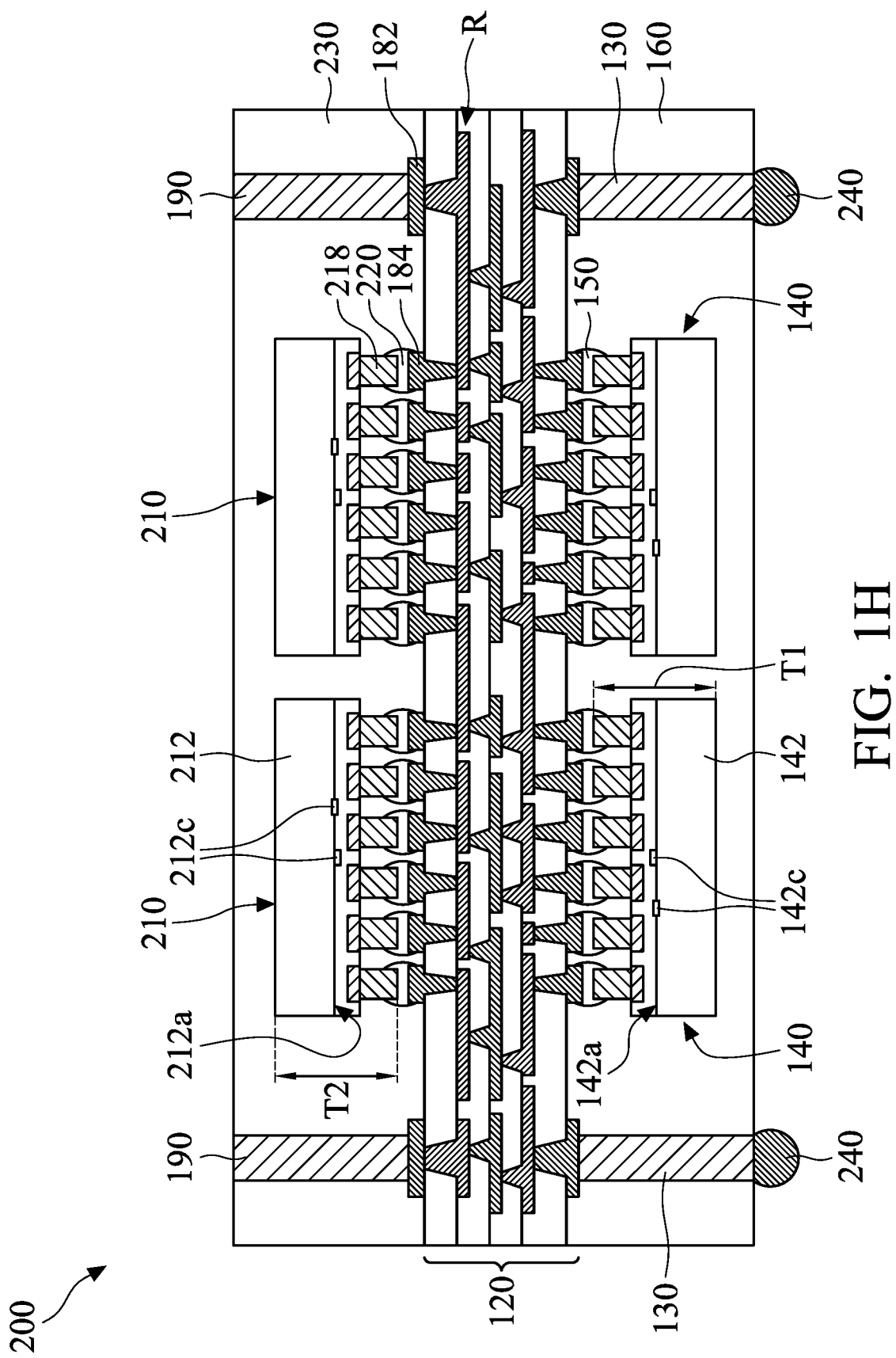

As shown in FIG. 1H, the carrier substrate 170 is removed, in accordance with some embodiments. As shown in FIG. 1H, conductive bumps 240 are formed to be connected to the conductive pillars 130, in accordance with some embodiments. The conductive bumps 240 are physically and electrically connected to the conductive pillars 130, in accordance with some embodiments. The conductive bumps 240 are made of a solder material, such as Sn and Ag or another suitable conductive material, in accordance with some embodiments. In some embodiments, the conductive bumps 240 are solder balls.

As shown in FIG. 1H, a dicing process is performed to cut the molding layers 160 and 230 and the redistribution structure 120 into individual chip package structures 200, in accordance with some embodiments. For the sake of simplicity, FIG. 1H only shows one of the chip package structures 200, in accordance with some embodiments.

Each of the chip package structures 200 includes the redistribution structure 120, the chips 140 and 210, the conductive bumps 150 and 220, the molding layers 160 and 230, and the conductive pillars 130 and 190, in accordance with some embodiments.

In the chip package structure 200, the front surface 212a of the substrate 212 and the front surface 142a of the substrate 142 face to each other, and therefore the chip package structure 200 is also referred to as a face-to-face chip package structure, in accordance with some embodiments. Since the front surfaces 212a and 142a face to each other, the conductive path between the electronic elements 212c and 142c are reduced. Therefore, the signal transmission speed between the electronic elements 212c and 142c is improved. As a result, the performance of the chip package structure 200 is improved.

In some embodiments, a thickness T1 of the chip 140 is different from a thickness T2 of the chip 210. In some embodiments, the thickness T1 of the chip 140 is the same as the thickness T2 of the chip 210.

Figure 1I:
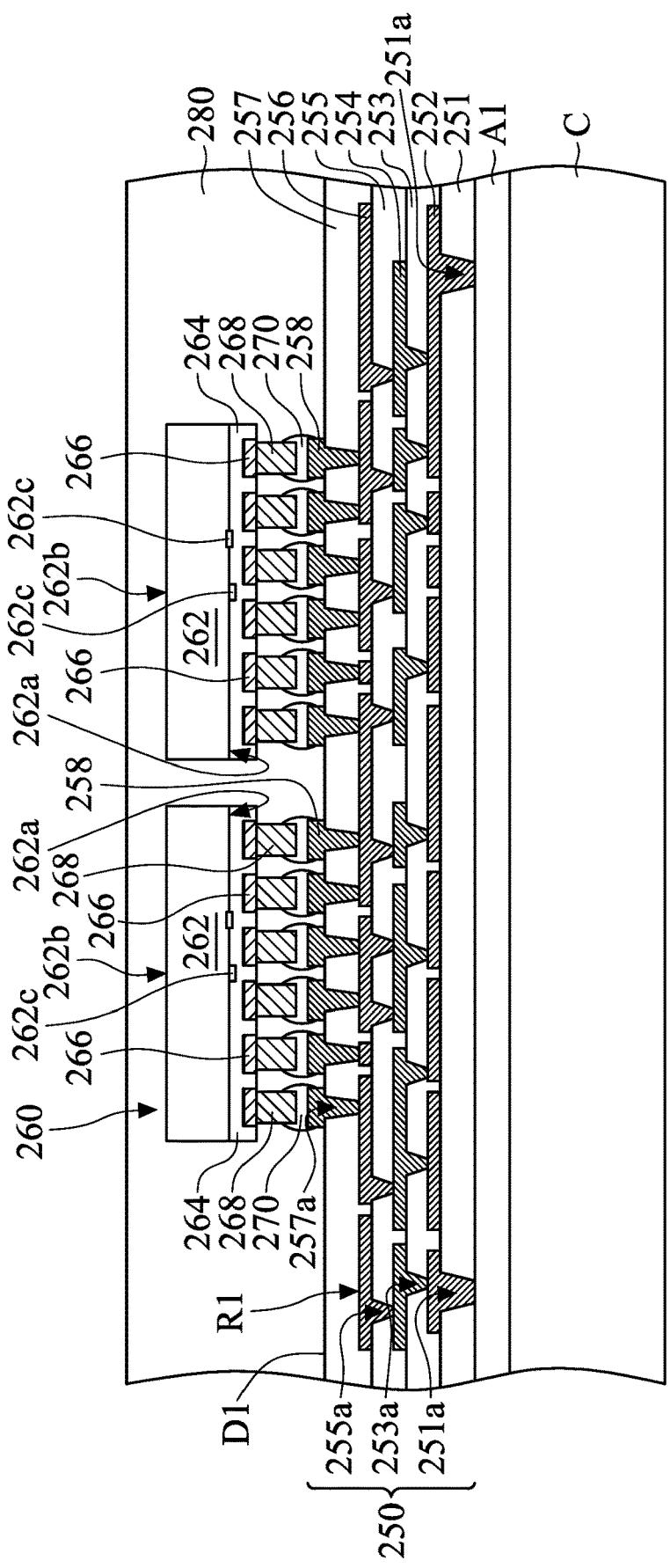

As shown in FIG. 1I, a carrier substrate C is provided, in accordance with some embodiments. The carrier substrate C is configured to provide temporary mechanical and structural support during subsequent processing steps, in accordance with some embodiments. The carrier substrate C includes glass, silicon oxide, aluminum oxide, metal, a combination thereof, and/or the like, in accordance with some embodiments. The carrier substrate C includes a metal frame, in accordance with some embodiments.

As shown in FIG. 1I, an adhesive layer A1 is formed over the carrier substrate C, in accordance with some embodiments. The adhesive layer A1 is in direct contact with the carrier substrate C, in accordance with some embodiments. The adhesive layer A1 is made of an insulating material, such as a polymer material, in accordance with some embodiments. The adhesive layer A1 is formed using a coating process or another suitable process.

As shown in FIG. 1I, a dielectric layer 251, a wiring layer 252, a dielectric layer 253, a wiring layer 254, a dielectric layer 255, a wiring layer 256, a dielectric layer 257, and conductive pads 258 are sequentially formed over the adhesive layer A1, in accordance with some embodiments.

The dielectric layer 251 is in direct contact with the adhesive layer A1, in accordance with some embodiments. The dielectric layer 251 has openings 251a exposing a portion of the adhesive layer A1, in accordance with some embodiments. The dielectric layer 251 is made of an insulating material such as a polymer material (e.g., polybenzoxazole or polyimide), nitride (e.g., silicon nitride), oxide (e.g., silicon oxide), silicon oxynitride, or the like, in accordance with some embodiments.

The wiring layer 252 is formed over the dielectric layer 251 and extends into the openings 251a, in accordance with some embodiments. The wiring layer 252 is in direct contact with the adhesive layer A1, in accordance with some embodiments. The wiring layer 252 is made of a conductive material, such as metal (e.g. copper, aluminum, or tungsten), in accordance with some embodiments.

The dielectric layer 253 is formed over the wiring layer 252 and the dielectric layer 251, in accordance with some embodiments. The dielectric layer 253 has openings 253a exposing a portion of the wiring layer 252, in accordance with some embodiments. The wiring layer 254 is formed over the dielectric layer 253 and extends into the openings 253a, in accordance with some embodiments. The wiring layer 254 is electrically connected to the wiring layer 252, in accordance with some embodiments.

The dielectric layer 255 is formed over the wiring layer 254 and the dielectric layer 253, in accordance with some embodiments. The dielectric layer 255 has openings 255a exposing a portion of the wiring layer 254, in accordance with some embodiments. The wiring layer 256 is formed over the dielectric layer 255 and extends into the openings 255a, in accordance with some embodiments. The wiring layer 256 is electrically connected to the wiring layer 254, in accordance with some embodiments.

The dielectric layer 257 is formed over the wiring layer 256 and the dielectric layer 255, in accordance with some embodiments. The dielectric layer 257 has openings 257a exposing a portion of the wiring layer 256, in accordance with some embodiments. The conductive pads 258 are formed over the dielectric layer 257 and extend into the openings 257a, in accordance with some embodiments. The conductive pads 258 are electrically connected to the wiring layer 256, in accordance with some embodiments.

The dielectric layers 253, 255, and 257 are made of a dielectric material that is the same as or similar to that of the dielectric layer 251, in accordance with some embodiments. The wiring layers 254 and 256 and the conductive pads 258 are made of a conductive material that is the same as or similar to that of the wiring layer 252, in accordance with some embodiments.

The dielectric layers 251, 253, 255, and 257 together form a dielectric structure D1, in accordance with some embodiments. The wiring layers 252, 254, and 256 together form a wiring structure R1, in accordance with some embodiments.

The wiring structure R1 is formed in the dielectric structure D1, in accordance with some embodiments. The dielectric structure D1, the wiring structure R1, and the conductive pads 258 together form a redistribution structure 250, in accordance with some embodiments.

As shown in FIG. 1I, chips 260 are provided, in accordance with some embodiments. Each of the chips 260 includes a substrate 262, a dielectric layer 264, bonding pads 266, and conductive structures 268, in accordance with some embodiments.

The substrate 262 is also referred to as a semiconductor substrate, a system-on-chip (SoC), a logic die, or a memory die, in accordance with some embodiments. In some embodiments, the substrate 262 is made of at least an elementary semiconductor material including silicon or germanium in a single crystal, polycrystal, or amorphous structure.

In some other embodiments, the substrate 262 is made of a compound phosphide, indium arsenide, an alloy semiconductor, such as SiGe, or GaAsP, or a combination thereof. The substrate 262 may also include multi-layer semiconductors, semiconductor on insulator (SOI) (such as silicon on insulator or germanium on insulator), or a combination thereof.

The substrate 262 has a front surface 262a and a back surface 262b opposite to the front surface 262a, in accordance with some embodiments. In some embodiments, electronic elements 262c are formed on the front surface 262a or in the substrate 262 adjacent to the front surface 262a. The electronic elements 262c include active elements (e.g. transistors, diodes, or the like) and/or passive elements (e.g. resistors, capacitors, inductors, or the like).

In some embodiments, active elements (e.g. transistors, diodes, or the like) and passive elements (e.g. resistors, capacitors, inductors, or the like) are not formed on the back surface 262b or in the substrate 262 adjacent to the back surface 262b. That is, there is no active element and no passive element formed directly on the back surface 262b or in the substrate 262 adjacent to the back surface 262b. In some other embodiments, active elements (e.g. transistors, diodes, or the like) and passive elements (e.g. resistors, capacitors, inductors, or the like) are formed on the back surface 262b or in the substrate 262 adjacent to the back surface 262b.

As shown in FIG. 1I, in each of the chips 260, the dielectric layer 264 is formed over the substrate 262, in accordance with some embodiments. The bonding pads 266 are formed in the dielectric layer 264, in accordance with some embodiments. The bonding pads 266 are electrically connected to the electronic elements 262c formed in/over the substrate 262, in accordance with some embodiments. The bonding pads 266 are made of a conductive material, such as metal (e.g., copper or aluminum), in accordance with some embodiments.

As shown in FIG. 1I, the conductive structures 268 are formed over the respective bonding pads 266, in accordance with some embodiments. The conductive structures 268 are electrically connected to the bonding pads 266, in accordance with some embodiments. The conductive structures 268 include conductive pillars, in accordance with some embodiments. The conductive structures 268 are made of a conductive material, such as metal (e.g. copper, aluminum, or tungsten), in accordance with some embodiments.

As shown in FIG. 1I, the chips 260 are bonded to the conductive pads 258 through conductive bumps 270, in accordance with some embodiments. The conductive bumps 270 are between the conductive structures 268 of the chips 260 and the conductive pads 258, in accordance with some embodiments.

The chips 260 are electrically connected to the conductive pads 258 and the wiring structure R1 through the conductive bumps 270 therebetween, in accordance with some embodiments. The conductive bumps 270 are made of a solder material, such as Sn and Ag or another suitable conductive material, in accordance with some embodiments.

As shown in FIG. 1I, a molding layer 280 is formed over the redistribution structure 250 to cover and surround the chips 260 and the conductive bumps 270, in accordance with some embodiments. The molding layer 280 is made of a polymer material or another suitable insulating material. The molding layer 280 is in direct contact with the chips 260 and the conductive bumps 270, in accordance with some embodiments.

Figure 1J:
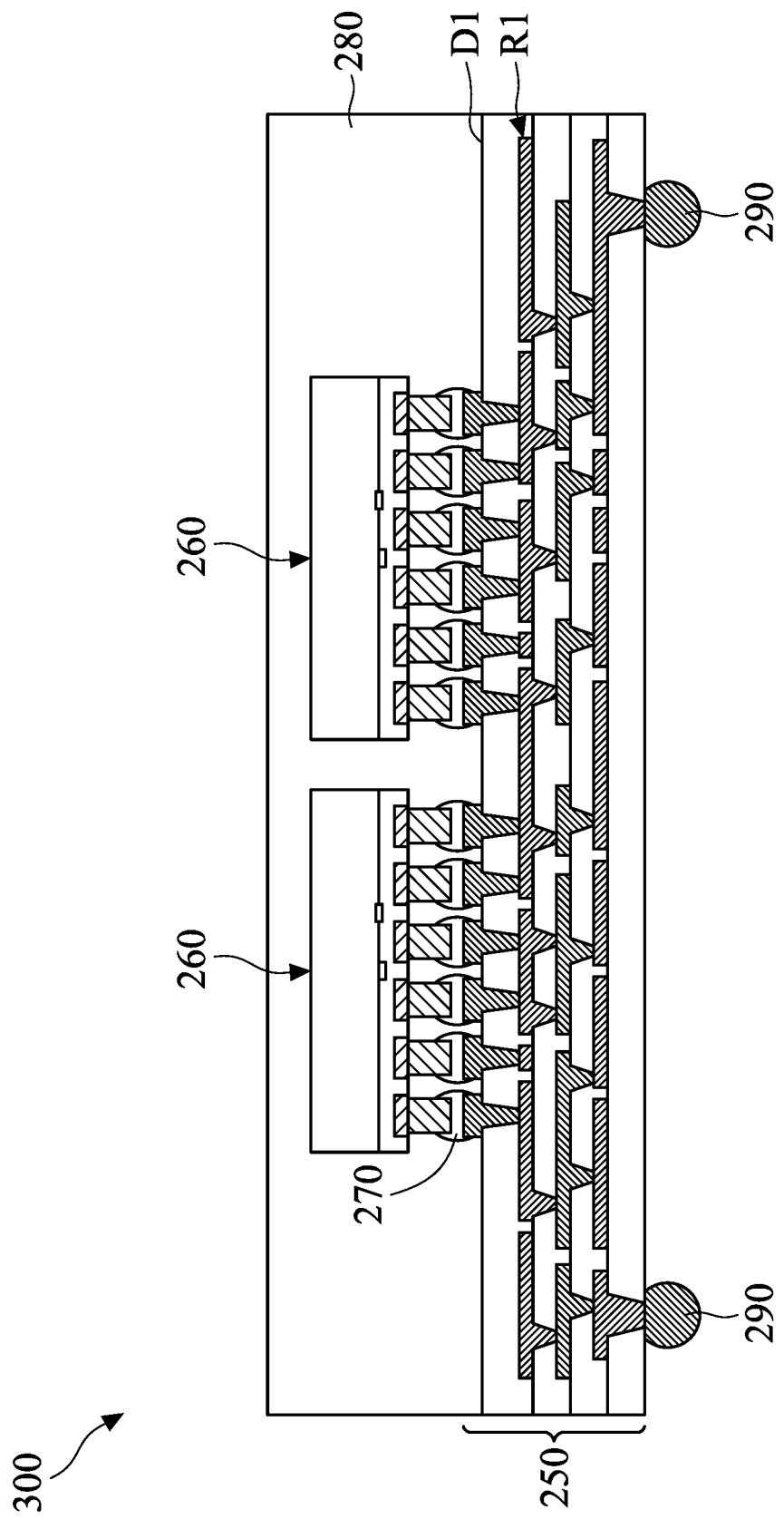

As shown in FIG. 1J, the carrier substrate C and the adhesive layer A1 are removed, in accordance with some embodiments. As shown in FIG. 1J, conductive bumps 290 are formed to be connected to the wiring structure R1, in accordance with some embodiments. The conductive bumps 290 are physically and electrically connected to the wiring structure R1, in accordance with some embodiments. The conductive bumps 290 are made of a solder material, such as Sn and Ag or another suitable conductive material, in accordance with some embodiments. In some embodiments, the conductive bumps 290 are solder balls.

As shown in FIG. 1J, a dicing process is performed to cut the molding layer 280 and the redistribution structure 250 into individual chip package structures 300, in accordance with some embodiments. For the sake of simplicity, FIG. 1J only shows one of the chip package structures 300, in accordance with some embodiments. Each of the chip package structures 300 includes the redistribution structure 250, the chip 260, the conductive bumps 270, and the molding layer 280, in accordance with some embodiments.

Figure 1K:
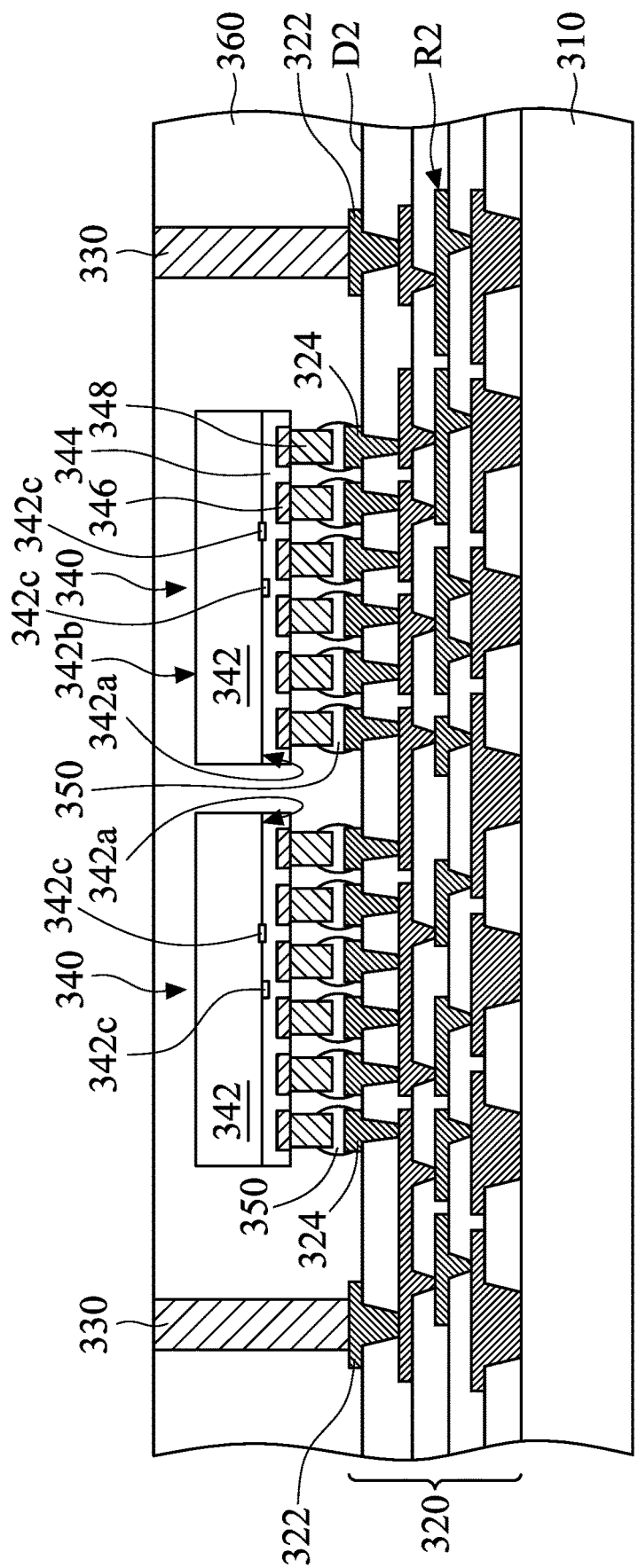

As shown in FIG. 1K, a carrier substrate 310 is provided, in accordance with some embodiments. The carrier substrate 310 is configured to provide temporary mechanical and structural support during subsequent processing steps, in accordance with some embodiments. The carrier substrate 310 includes glass, silicon oxide, aluminum oxide, metal, a combination thereof, and/or the like, in accordance with some embodiments. The carrier substrate 310 includes a metal frame, in accordance with some embodiments.

As shown in FIG. 1K, a redistribution structure 320 is formed over the carrier substrate 310, in accordance with some embodiments. The redistribution structure 320 includes a dielectric structure D2, a wiring structure R2, and conductive pads 322 and 324, in accordance with some embodiments. The wiring structure R2 is formed in the dielectric structure D2, in accordance with some embodiments. The conductive pads 322 and 324 are formed over the dielectric structure D2 and electrically connected to the wiring structure R2, in accordance with some embodiments.

The dielectric structure D2 is made of an insulating material such as a polymer material (e.g., polybenzoxazole or polyimide), nitride (e.g., silicon nitride), oxide (e.g., silicon oxide), silicon oxynitride, or the like, in accordance with some embodiments. The wiring structure R2 is made of a conductive material, such as metal (e.g. copper, aluminum, or tungsten), in accordance with some embodiments.

As shown in FIG. 1K, conductive pillars 330 are formed over the conductive pads 322, in accordance with some embodiments. The conductive pillars 330 are electrically connected to the conductive pads 322 and the wiring structure R2, in accordance with some embodiments.

As shown in FIG. 1K, chips 340 are provided, in accordance with some embodiments. Each of the chips 340 includes a substrate 342, a dielectric layer 344, bonding pads 346, and conductive structures 348, in accordance with some embodiments.

The substrate 342 is also referred to as a semiconductor substrate, a system-on-chip (SoC), a logic die, or a memory die, in accordance with some embodiments. In some embodiments, the substrate 342 is made of at least an elementary semiconductor material including silicon or germanium in a single crystal, polycrystal, or amorphous structure.

In some other embodiments, the substrate 342 is made of a compound phosphide, indium arsenide, an alloy semiconductor, such as SiGe, or GaAsP, or a combination thereof. The substrate 342 may also include multi-layer semiconductors, semiconductor on insulator (SOI) (such as silicon on insulator or germanium on insulator), or a combination thereof.

The substrate 342 has a front surface 342a and a back surface 342b opposite to the front surface 342a, in accordance with some embodiments. In some embodiments, electronic elements 342c are formed on the front surface 342a or in the substrate 342 adjacent to the front surface 342a. The electronic elements 342c include active elements (e.g. transistors, diodes, or the like) and/or passive elements (e.g. resistors, capacitors, inductors, or the like).

In some embodiments, active elements (e.g. transistors, diodes, or the like) and passive elements (e.g. resistors, capacitors, inductors, or the like) are not formed on the back surface 342b or in the substrate 342 adjacent to the back surface 342b. That is, there is no active element and no passive element formed directly on the back surface 342b or in the substrate 342 adjacent to the back surface 342b. In some other embodiments, active elements (e.g. transistors, diodes, or the like) and passive elements (e.g. resistors, capacitors, inductors, or the like) are formed on the back surface 342b or in the substrate 342 adjacent to the back surface 342b.

As shown in FIG. 1K, in each of the chips 340, the dielectric layer 344 is formed over the substrate 342, in accordance with some embodiments. The bonding pads 346 are formed in the dielectric layer 344, in accordance with some embodiments. The bonding pads 346 are electrically connected to the electronic elements 342c formed in/over the substrate 342, in accordance with some embodiments. The bonding pads 346 is made of a conductive material, such as metal (e.g., copper or aluminum), in accordance with some embodiments.

As shown in FIG. 1K, the conductive structures 348 are formed over the respective bonding pads 346, in accordance with some embodiments. The conductive structures 348 are electrically connected to the bonding pads 346, in accordance with some embodiments. The conductive structures 348 include conductive pillars, in accordance with some embodiments. The conductive structures 348 are made of a conductive material, such as metal (e.g. copper, aluminum, or tungsten), in accordance with some embodiments.

As shown in FIG. 1K, the chips 340 are bonded to the conductive pads 324 through conductive bumps 350, in accordance with some embodiments. The conductive bumps 350 are between the conductive structures 348 of the chips 340 and the conductive pads 324, in accordance with some embodiments.

The chips 340 are electrically connected to the conductive pads 324 and the wiring structure R2 through the conductive bumps 350 therebetween, in accordance with some embodiments. The conductive bumps 350 are made of a solder material, such as Sn and Ag or another suitable conductive material, in accordance with some embodiments.

As shown in FIG. 1K, a molding layer 360 is formed over the redistribution structure 320 to cover and surround the chips 340, the conductive bumps 350, and the conductive pillars 330, in accordance with some embodiments. The molding layer 360 is made of a polymer material or another suitable insulating material. The molding layer 360 is in direct contact with the chips 340 and the conductive bumps 350, in accordance with some embodiments.

Figure 1L:
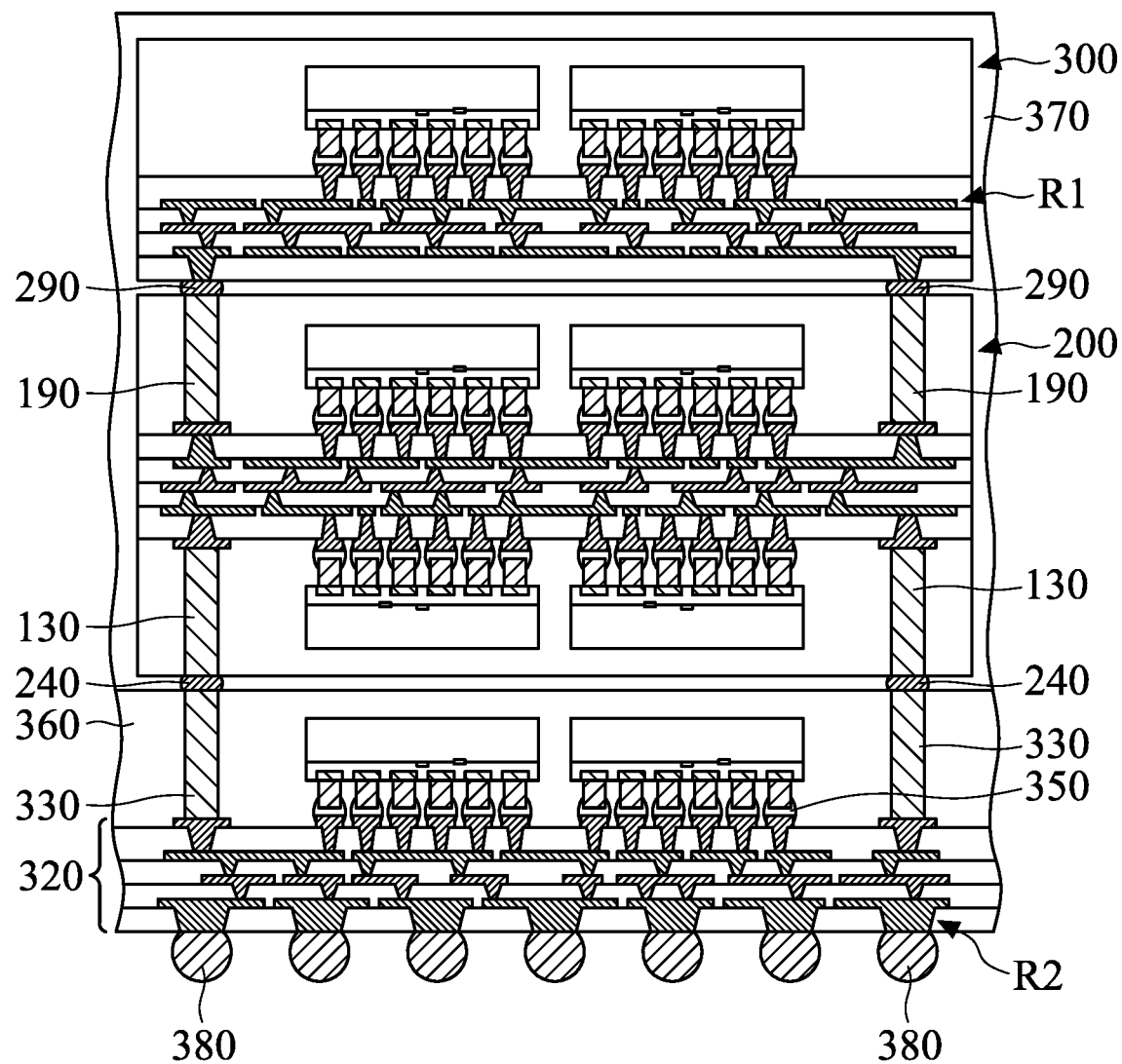

As shown in FIG. 1L, the chip package structures 200 are bonded to the conductive pillars 330 through the conductive bumps 240, in accordance with some embodiments. The conductive bumps 240 are between the conductive pillars 130 and 330, in accordance with some embodiments. The conductive pillars 130 are electrically connected to the conductive pillars 330 through the conductive bumps 240, in accordance with some embodiments.

As shown in FIG. 1L, the chip package structures 300 are bonded to the conductive pillars 190 through the conductive bumps 290, in accordance with some embodiments. The conductive bumps 290 are between the conductive pillars 190 and the wiring structure R1, in accordance with some embodiments. The conductive pillars 190 are electrically connected to the wiring structure R1 through the conductive bumps 290, in accordance with some embodiments.

As shown in FIG. 1L, a molding layer 370 is formed over the molding layer 360 to cover and surround the chip package structures 200 and 300 and the conductive bumps 240 and 290, in accordance with some embodiments. The molding layer 370 is made of a polymer material or another suitable insulating material. The molding layer 370 is in direct contact with the chip package structures 200 and 300 and the conductive bumps 240 and 290, in accordance with some embodiments.

As shown in FIG. 1L, the carrier substrate 310 is removed, in accordance with some embodiments. As shown in FIG. 1L, conductive bumps 380 are formed to be connected to the wiring structure R2, in accordance with some embodiments. The conductive bumps 380 are physically and electrically connected to the wiring structure R2, in accordance with some embodiments. The conductive bumps 380 are made of a solder material, such as Sn and Ag or another suitable conductive material, in accordance with some embodiments. In some embodiments, the conductive bumps 380 are solder balls.

Figure 1M:
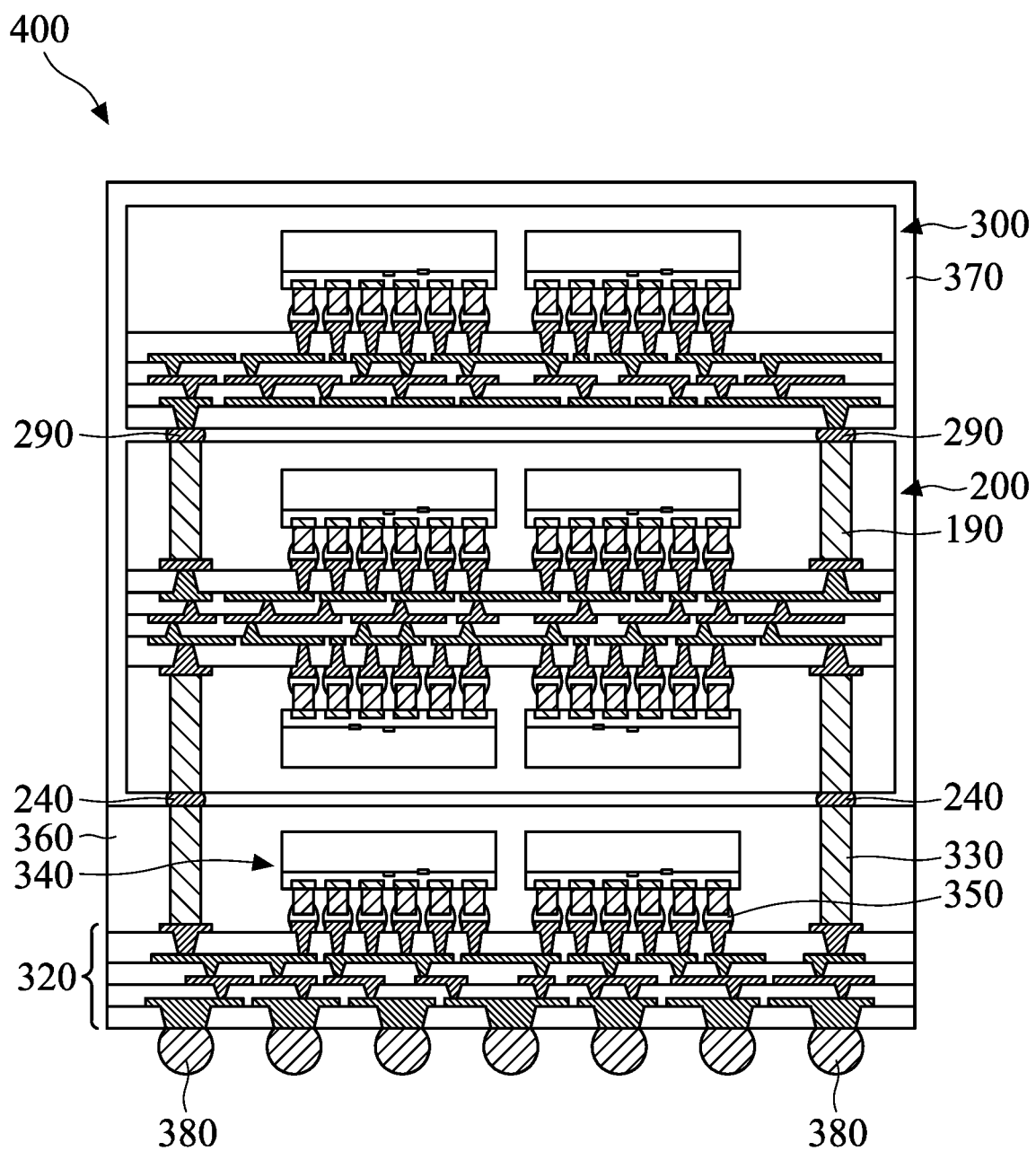

As shown in FIG. 1M, a dicing process is performed to cut the molding layers 360 and 370 and the redistribution structure 320 into individual chip package structures 400, in accordance with some embodiments. For the sake of simplicity, FIG. 1M only shows one of the chip package structures 400, in accordance with some embodiments.

Each of the chip package structures 400 includes the chip package structures 200 and 300, the redistribution structure 320, the chips 340, the conductive bumps 240, 290, 350, and 380, the molding layers 360 and 370, and the conductive pillars 330, in accordance with some embodiments. In the chip package structure 400, the sidewalls of the molding layers 360 and 370 and the redistribution structure 320 are coplanar, in accordance with some embodiments.

Figure 2:
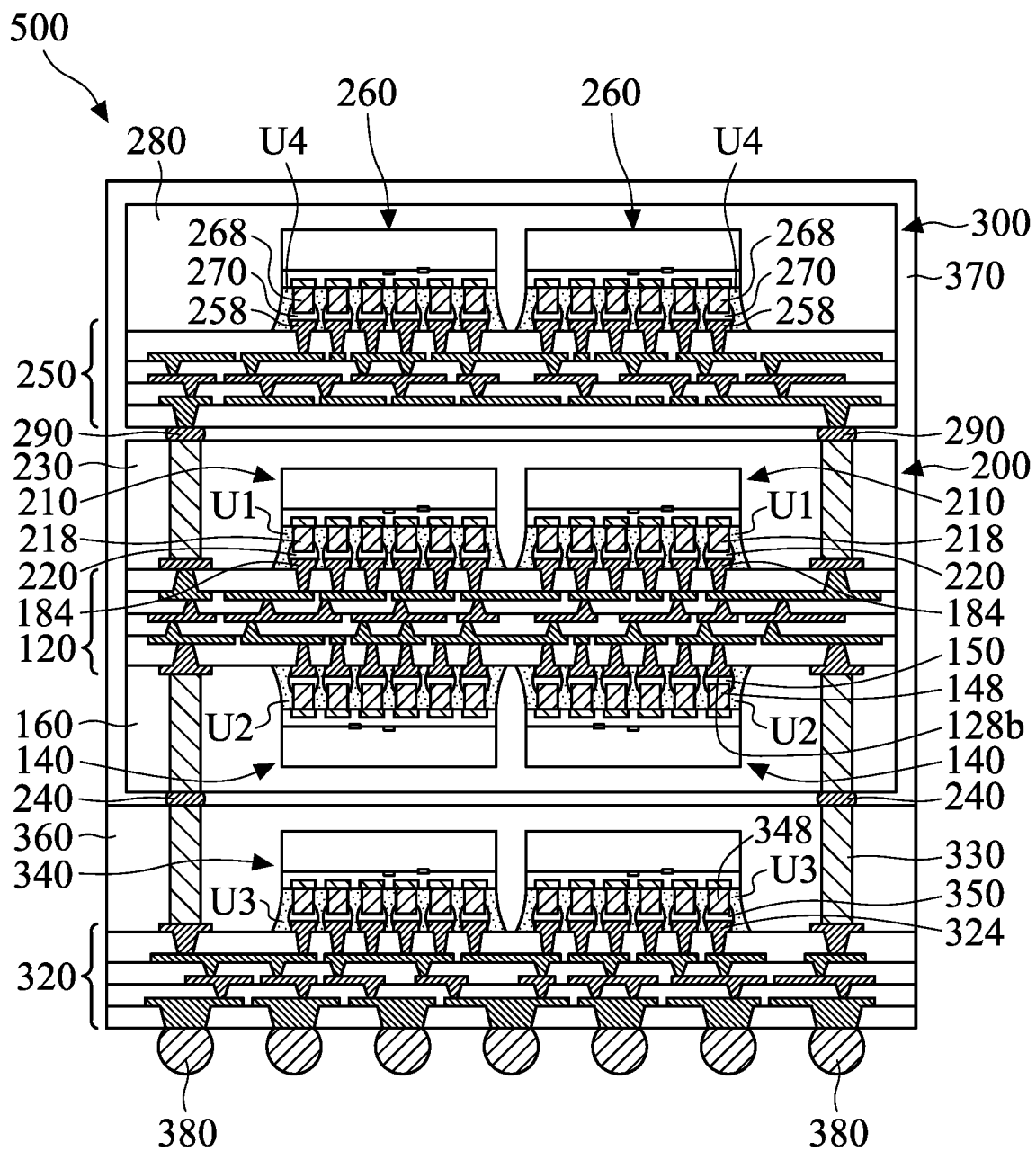
FIG. 2 is a cross-sectional view of a chip package structure, in accordance with some embodiments.

FIG. 2 is a cross-sectional view of a chip package structure, in accordance with some embodiments. As shown in FIG. 2, a chip package structure 500 is similar to the chip package structure 400 of FIG. 1M, except that the chip package structure 500 further includes underfill layers U1, U2, U3, and U4, in accordance with some embodiments.

The underfill layers U1 are formed between the chips 210 and the redistribution structure 120 before the formation of the molding layer 230, in accordance with some embodiments. The underfill layer U1 surrounds the conductive bumps 220, the conductive structures 218, and the conductive pads 184, in accordance with some embodiments.

The underfill layer U1 is in direct contact with the conductive bumps 220, the conductive structures 218, and the conductive pads 184, in accordance with some embodiments. The underfill layer U1 includes an insulating material (e.g., a polymer material), in accordance with some embodiments.

The underfill layers U2 are formed between the chips 140 and the redistribution structure 120 before the formation of the molding layer 160, in accordance with some embodiments. The underfill layer U2 surrounds the conductive bumps 150, the conductive structures 148, and the conductive pads 128*b*, in accordance with some embodiments.

The underfill layer U2 is in direct contact with the conductive bumps 150, the conductive structures 148, and the conductive pads 128*b*, in accordance with some embodiments. The underfill layer U2 includes an insulating material (e.g., a polymer material), in accordance with some embodiments.

The underfill layers U3 are formed between the chips 340 and the redistribution structure 320 before the formation of the molding layer 360, in accordance with some embodiments. The underfill layer U3 surrounds the conductive bumps 350, the conductive structures 348, and the conductive pads 324, in accordance with some embodiments.

The underfill layer U3 is in direct contact with the conductive bumps 350, the conductive structures 348, and the conductive pads 324, in accordance with some embodiments. The underfill layer U3 includes an insulating material (e.g., a polymer material), in accordance with some embodiments.

The underfill layers U4 are formed between the chips 260 and the redistribution structure 250 before the formation of the molding layer 280, in accordance with some embodiments. The underfill layer U4 surrounds the conductive bumps 270, the conductive structures 268, and the conductive pads 258, in accordance with some embodiments.

The underfill layer U4 is in direct contact with the conductive bumps 270, the conductive structures 268, and the conductive pads 258, in accordance with some embodiments. The underfill layer U4 includes an insulating material (e.g., a polymer material), in accordance with some embodiments. The materials of the underfill layers U1, U2, U3, and U4 are different from the materials of the molding layers 230, 160, 360, and 280, in accordance with some embodiments.

Figure 3:
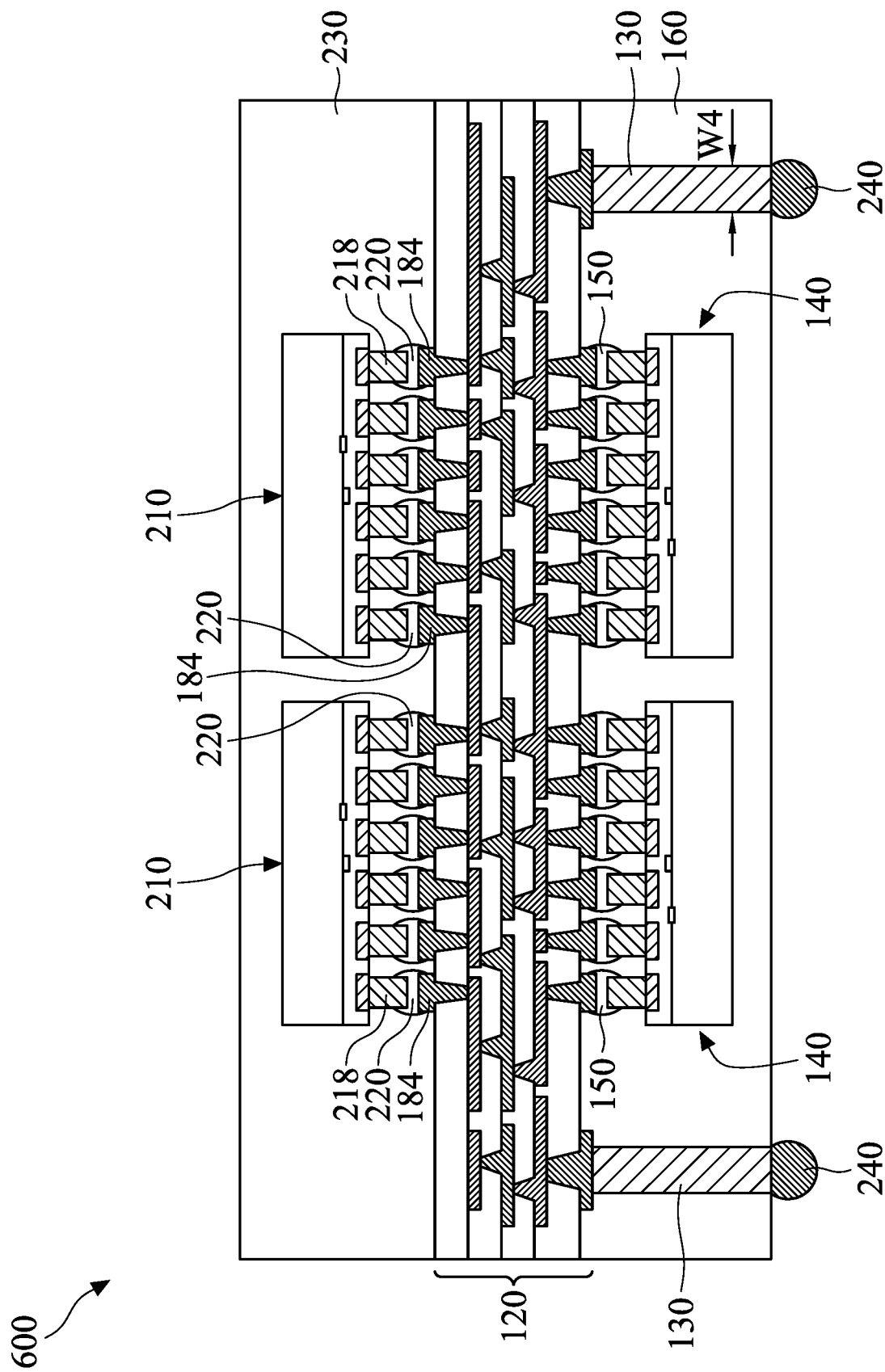
FIG. 3 is a cross-sectional view of a chip package structure, in accordance with some embodiments.

FIG. 3 is a cross-sectional view of a chip package structure, in accordance with some embodiments. As shown in FIG. 3, a chip package structure 600 is similar to the chip package structure 200 of FIG. 1H, except that the chip package structure 600 does not include the conductive pillars 190, in accordance with some embodiments.

Figure 4:
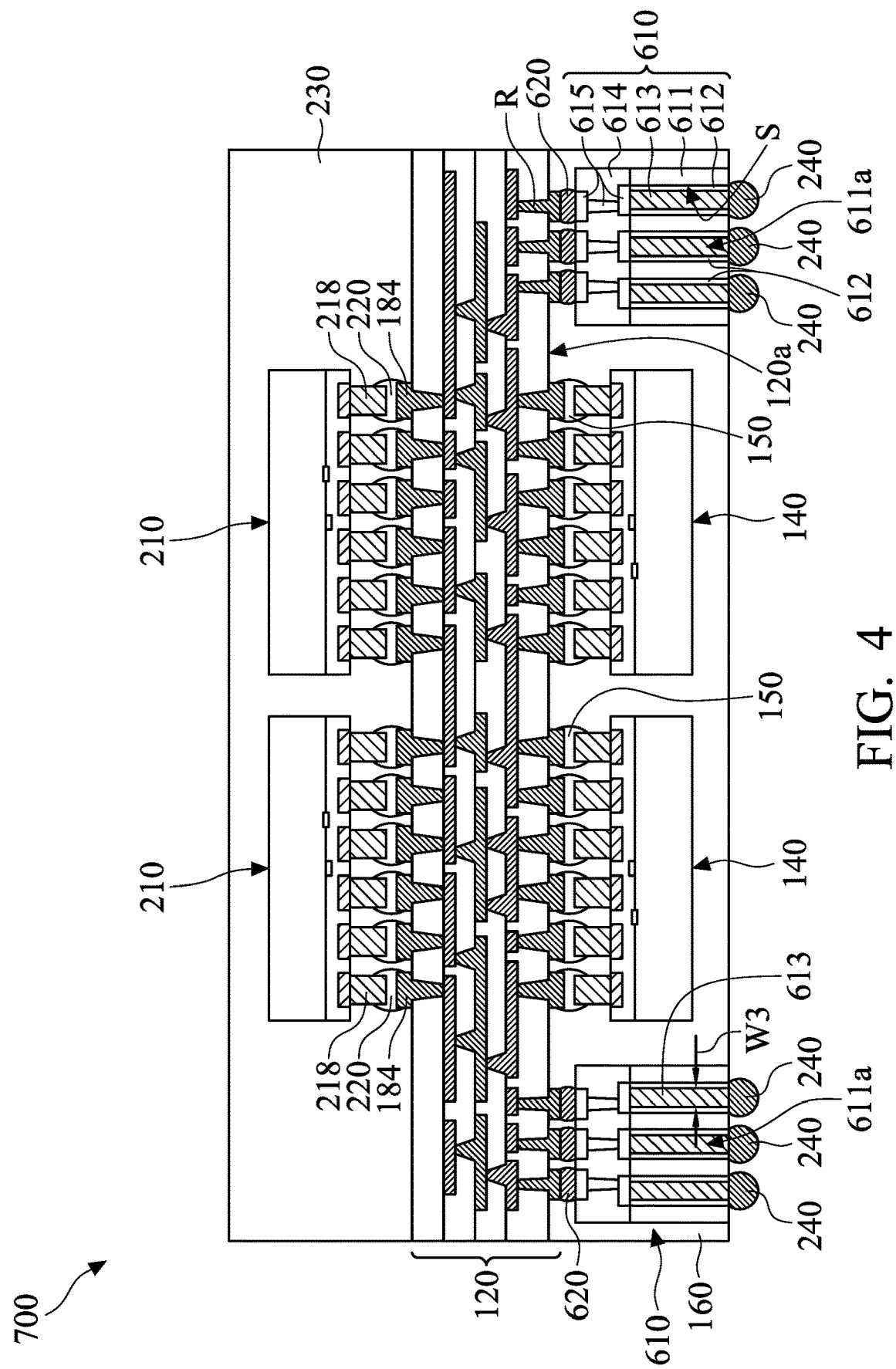
FIG. 4 is a cross-sectional view of a chip package structure, in accordance with some embodiments.

FIG. 4 is a cross-sectional view of a chip package structure, in accordance with some embodiments. As shown in FIG. 4, a chip package structure 700 is similar to the chip package structure 600 of FIG. 3, except that the chip package structure 700 further includes interposers 610 and does not include the conductive pillars 130, in accordance with some embodiments.

Each of the interposers 610 includes a substrate 611, dielectric layers 612, conductive structures 613, a dielectric structure 614, and a wiring structure 615, in accordance with some embodiments. The substrate 611 is made of at least an elementary semiconductor material including silicon or germanium in a single crystal, polycrystal, or amorphous structure.

In some other embodiments, the substrate 611 is made of a compound semiconductor, such as silicon carbide, gallium arsenide, gallium phosphide, indium phosphide, indium arsenide, an alloy semiconductor, such as SiGe, or GaAsP, or a combination thereof. The materials of the substrate 611 are different from that of the molding layer 160, in accordance with some embodiments.

The substrate 611 has through holes 611*a*, in accordance with some embodiments. The dielectric layers 612 are respectively formed over inner walls S of the through holes 611*a*, in accordance with some embodiments. The conductive structures 613 are respectively formed in the through holes 611*a* to pass through the substrate 611, in accordance with some embodiments. The conductive structures 613 are also referred to as conductive pillars, in accordance with some embodiments. The dielectric structure 614 is formed over the substrate 611, the dielectric layers 612, and the conductive structures 613, in accordance with some embodiments.

The dielectric structure 614 includes dielectric layers, in accordance with some embodiments. The wiring structure 615 is formed in the dielectric structure 614, in accordance with some embodiments. The wiring structure 615 includes conductive lines, in accordance with some embodiments. The wiring structure 615 is electrically connected to the conductive structures 613, in accordance with some embodiments.

The interposers 610 are bonded to the wiring structure R of the redistribution structure 120 through conductive bumps 620, in accordance with some embodiments. The wiring structure 615 is electrically connected to the wiring structure R through conductive bumps 620, in accordance with some embodiments.

As shown in FIG. 4, conductive bumps 240 are formed to be connected to the conductive structures 613, in accordance with some embodiments. The conductive bumps 240 are electrically connected to the conductive structures 613, in accordance with some embodiments. The molding layer 160 surrounds the interposers 610, the conductive bumps 150 and 620, and the chips 140, in accordance with some embodiments.

Since the width W3 of each of the conductive structures 613 is less than the width W4 of each of the conductive pillars 130 (as shown in FIG. 3), the interposers 610 provides more conducting paths for the wiring structure R than the conductive pillars 130 in the same assembly area of the redistribution structure 120, in accordance with some embodiments.

Figure 5:
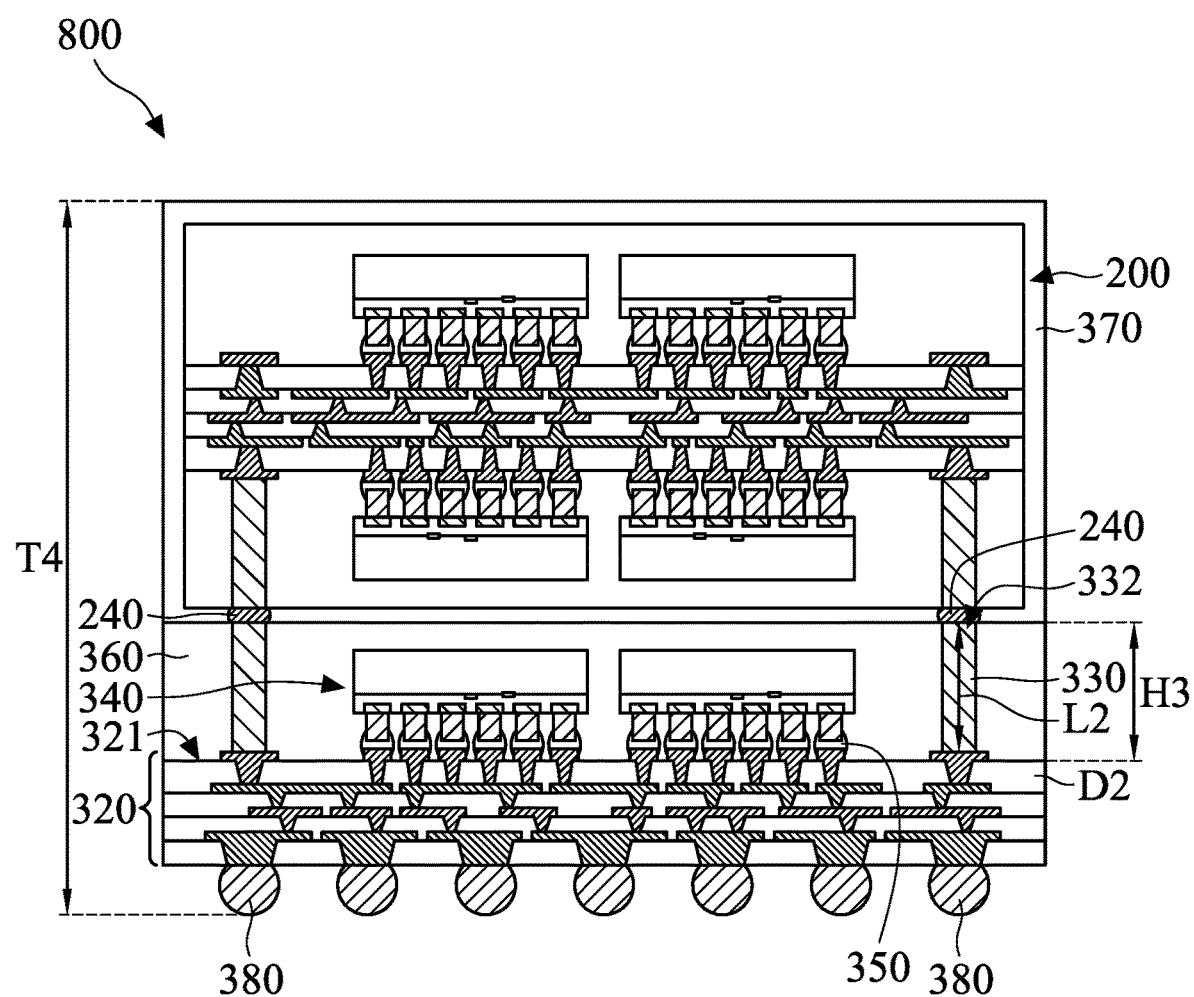
FIG. 5 is a cross-sectional view of a chip package structure, in accordance with some embodiments.

FIG. 5 is a cross-sectional view of a chip package structure, in accordance with some embodiments. As shown in FIG. 5, a chip package structure 800 is similar to the chip package structure 400 of FIG. 1M, except that the chip package structure 800 does not include the chip package structure 300, the conductive bumps 290, and the conductive pillars 190, in accordance with some embodiments.

Figure 6:
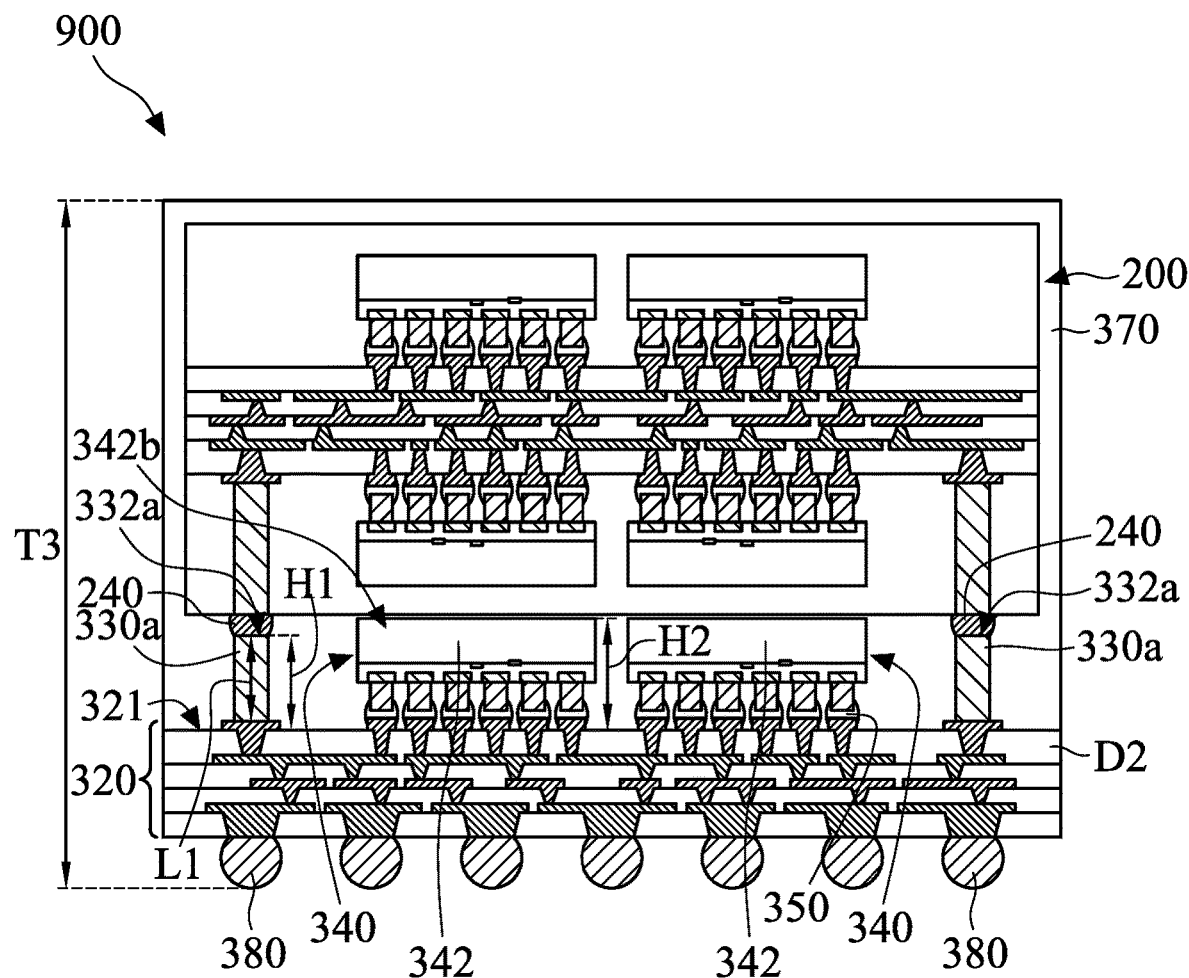
FIG. 6 is a cross-sectional view of a chip package structure, in accordance with some embodiments.

FIG. 6 is a cross-sectional view of a chip package structure, in accordance with some embodiments. As shown in FIG. 6, a chip package structure 900 is similar to the chip package structure 800 of FIG. 5, except that the chip package structure 900 does not include the molding layer 360, in accordance with some embodiments.

In the chip package structure 900, a height H1 of a top surface 332a of the conductive pillar 330a relative to a top surface 321 of the dielectric structure D2 of the redistribution structure 320 is less than a height H2 of the back surface 342b of the substrate 342 relative to the top surface 321, in accordance with some embodiments. The substrates 342 are between the conductive bumps 240, in accordance with some embodiments. The conductive bumps 240 surround the substrates 342, in accordance with some embodiments.

The height H1 is less than a height H3 of the top surface 332 of the conductive pillar 330 relative to the top surface 321 of the dielectric structure D2 of the redistribution structure 320 of FIG. 5, in accordance with some embodiments. In some embodiments, a length L1 of the conductive pillar 330a is less than a length L2 of the conductive pillar 330 of FIG. 5.

Since the height H1 is less than the height H3 of FIG. 5 (or the length L1 is less than the length L2 of FIG. 5), the total thickness T3 of the chip package structure 900 is less than the total thickness T4 of the chip package structure 800 of FIG. 5, in accordance with some embodiments. Therefore, the total thickness T3 of the chip package structure 900 is reduced, in accordance with some embodiments.

In some embodiments, a portion of the molding layer 370 is between the chip package structure 200 and the redistribution structure 320. The portion of the molding layer 370 surrounds the chips 340, the conductive bumps 240 and 350, and the conductive pillars 330, in accordance with some embodiments. The molding layer 370 is in direct contact with the chips 340, the conductive bumps 240 and 350, and the conductive pillars 330, in accordance with some embodiments.

Figure 7:
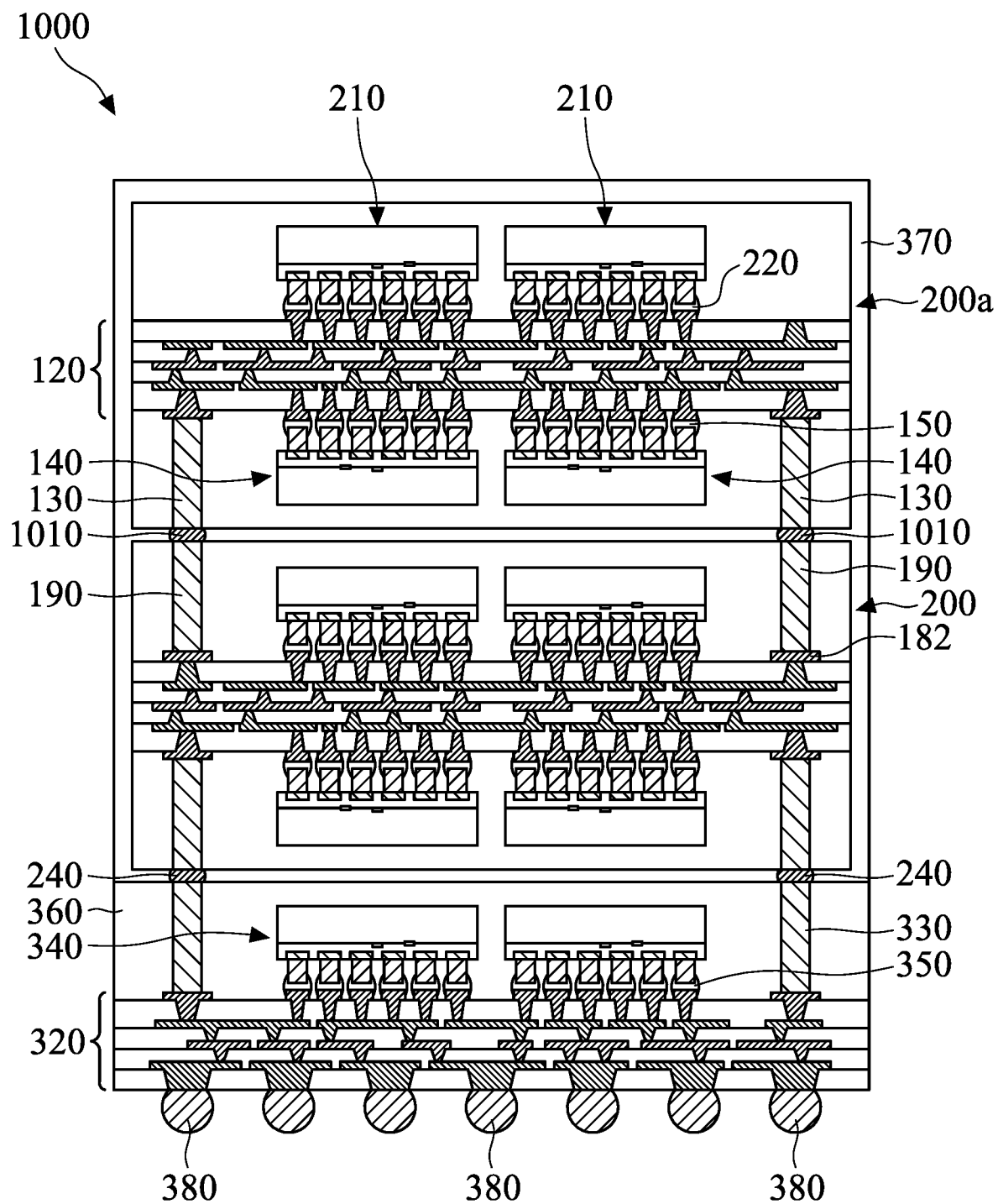
FIG. 7 is a cross-sectional view of a chip package structure, in accordance with some embodiments.

FIG. 7 is a cross-sectional view of a chip package structure, in accordance with some embodiments. As shown in FIG. 7, a chip package structure 1000 is similar to the chip package structure 800 of FIG. 5, except that the chip package structure 1000 further includes a chip package structure 200a, conductive bumps 1010, and the conductive pillars 190, in accordance with some embodiments.

The chip package structure 200a is similar to or the same as the chip package structure 200, in accordance with some embodiments. The conductive pillars 190 are formed over the conductive pad 182, in accordance with some embodiments. The conductive bumps 1010 connect the chip package structure 200a to the chip package structure 200, in accordance with some embodiments.

Figure 8A:
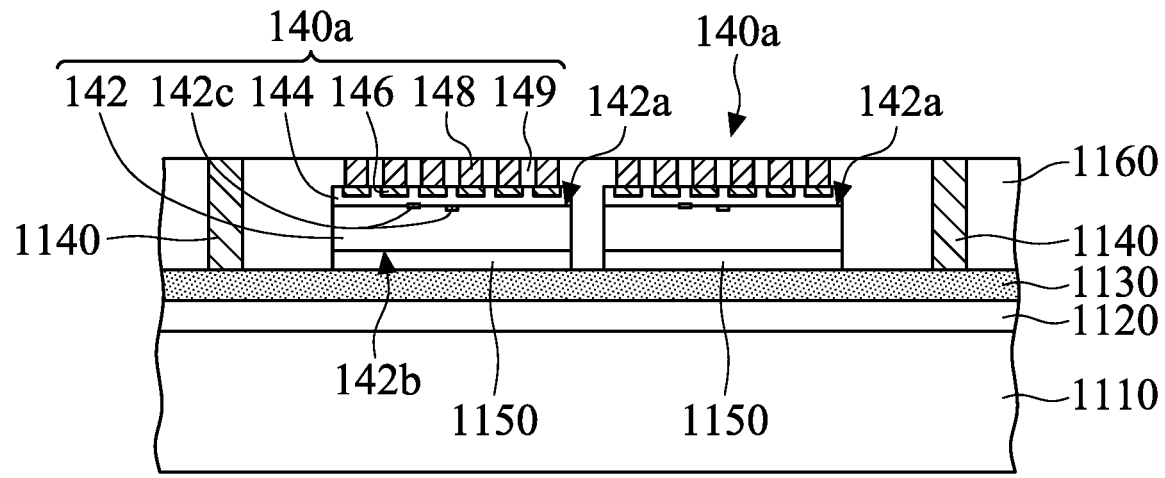
FIGS. 8A-8E are cross-sectional views of various stages of a process for forming a chip package structure, in accordance with some embodiments.

FIGS. 8A-8E are cross-sectional views of various stages of a process for forming a chip package structure, in accordance with some embodiments. As shown in FIG. 8A, a carrier substrate 1110 is provided, in accordance with some embodiments. The carrier substrate 1110 is configured to provide temporary mechanical and structural support during subsequent processing steps, in accordance with some embodiments. The carrier substrate 1110 includes glass, silicon oxide, aluminum oxide, metal, a combination thereof, and/or the like, in accordance with some embodiments. The carrier substrate 1110 includes a metal frame, in accordance with some embodiments.

As shown in FIG. 8A, an adhesive layer 1120 is formed over the carrier substrate 1110, in accordance with some embodiments. The adhesive layer 1120 includes any suitable adhesive material, such as an ultraviolet (UV) glue or a Light-to-Heat Conversion (LTHC) glue, which loses its adhesive properties when exposed to a UV light or laser, in accordance with some embodiments. The adhesive layer 1120 is formed using a lamination process, a spin coating process, a printing process, or another suitable process.

As shown in FIG. 8A, a buffer layer 1130 is formed over the adhesive layer 1120, in accordance with some embodiments. The buffer layer 1130 is configured to provide structural support for bonding and help reduce die shift during subsequent processes, in accordance with some embodiments. The buffer layer 1130 includes a polymer material, such as polybenzoxazole (PBO), polyimide, or epoxy, in accordance with some embodiments. The buffer layer 1130 is formed using a spin coating process, a chemical vapor deposition process, a laminating process, or a printing process, in accordance with some embodiments.

As shown in FIG. 8A, conductive pillars 1140 are formed over the buffer layer 1130, in accordance with some embodiments. The conductive pillars 1140 are made of a conductive material, such as metal (e.g., copper, aluminum, or tungsten) or an alloy thereof, in accordance with some embodiments.

As shown in FIG. 8A, chips 140a are provided, in accordance with some embodiments. Each of the chips 140a is similar to the chip 140 of FIG. 1B, except that each of the chips 140a further includes an insulating layer 149, in accordance with some embodiments. The insulating layer 149 is formed on the dielectric layer 144, in accordance with some embodiments. The insulating layer 149 surrounds the conductive structures 148, in accordance with some embodiments.

As shown in FIG. 8A, chips 140a are bonded to the buffer layer 1130 through an adhesive layer 1150, in accordance with some embodiments. The adhesive layer 1150 is made of an insulating material, such as a polymer material, in accordance with some embodiments.

As shown in FIG. 8A, a molding layer 1160 is formed over the buffer layer 1130 to surround the chips 140a and the conductive pillars 1140, in accordance with some embodiments. The molding layer 1160 is made of a polymer material or another suitable insulating material.

Figure 8B:
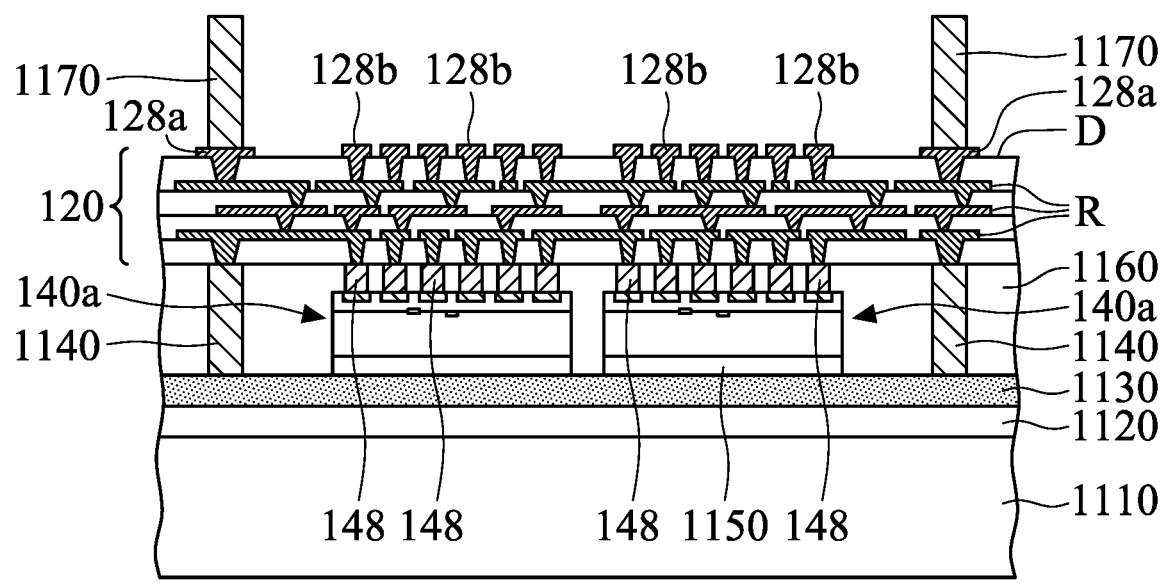

As shown in FIG. 8B, a redistribution structure 120 is formed over the molding layer 1160, the conductive pillars 1140, and the chips 140a, in accordance with some embodiments. The redistribution structure 120 is the same as the redistribution structure 120 of FIG. 1A, in accordance with some embodiments. The redistribution structure 120 includes a dielectric structure D, a wiring structure R, and conductive pads 128a and 128b, in accordance with some embodiments.

The wiring structure R is formed in the dielectric structure D, in accordance with some embodiments. The conductive pads 128a and 128b are formed over the dielectric structure D and extend into the dielectric structure D to be electrically connected to the wiring structure R, in accordance with some embodiments. The wiring structure R is electrically connected to the conductive structures 148 and the conductive pillars 1140, in accordance with some embodiments.

As shown in FIG. 8B, conductive pillars 1170 are formed over the conductive pads 128a, in accordance with some embodiments. The conductive pillars 1170 are electrically connected to the conductive pads 128a thereunder, respectively, in accordance with some embodiments.

Figure 8C:
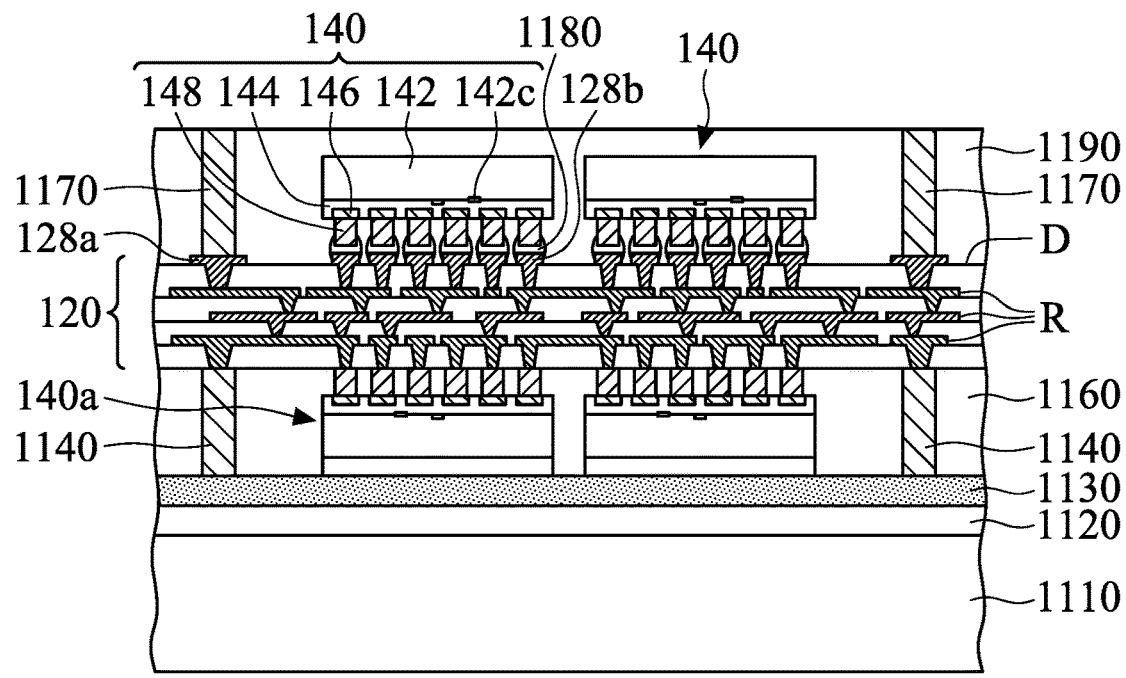

As shown in FIG. 8C, chips 140 are provided, in accordance with some embodiments. Each of the chips 140 is the same as the chip 140 of FIG. 1B, in accordance with some embodiments. Each of the chips 140 includes a substrate 142, electronic elements 142c, a dielectric layer 144, bonding pads 146, and conductive structures 148, in accordance with some embodiments.

As shown in FIG. 8C, chips 140 are bonded to the conductive pads 128*b* through conductive bumps 1180, in accordance with some embodiments. The chips 140 are electrically connected to the conductive pads 128*b* and the wiring structure R through the conductive bumps 1180 therebetween, in accordance with some embodiments. The conductive bumps 1180 are made of a solder material, such as Sn and Ag or another suitable conductive material, in accordance with some embodiments. The conductive bumps 1180 are solder balls, in accordance with some embodiments.

As shown in FIG. 8C, a molding layer 1190 is formed over the redistribution structure 120 to surround the conductive pillars 1170, the chips 140, and the conductive bumps 1180, in accordance with some embodiments. The molding layer 1190 is made of a polymer material or another suitable insulating material.

Figure 8D:
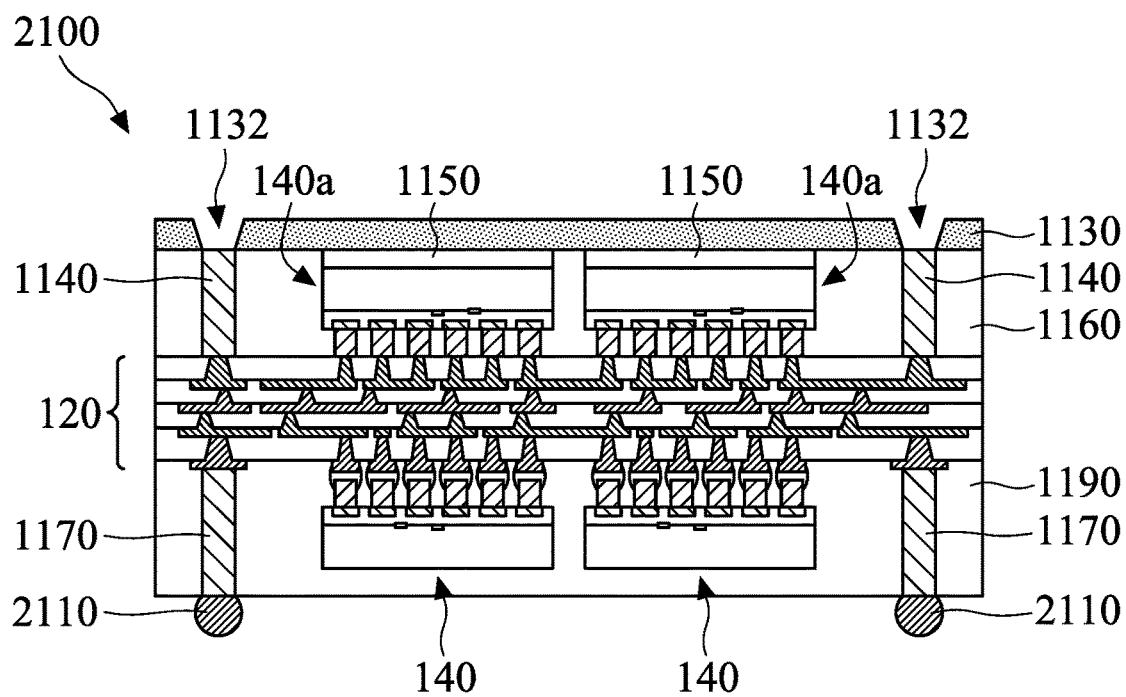

As shown in FIG. 8D, conductive bumps 2110 are formed over the conductive pillars 1170, in accordance with some embodiments. The conductive bumps 2110 are electrically connected to the conductive pillars 1170, in accordance with some embodiments. The conductive bumps 2110 are made of a solder material, such as Sn and Ag or another suitable conductive material, in accordance with some embodiments. As shown in FIG. 8D, the carrier substrate 1110 and the adhesive layer 1120 are removed, in accordance with some embodiments.

As shown in FIG. 8D, the redistribution structure 120 is flipped upside down, in accordance with some embodiments. As shown in FIG. 8D, a portion of the buffer layer 1130 is removed to form openings 1132 in the buffer layer 1130, in accordance with some embodiments. The openings 1132 expose the conductive pillars 1140, in accordance with some embodiments.

As shown in FIG. 8D, a dicing process is performed to cut the buffer layer 1130, the molding layers 1160 and 1190, and the redistribution structure 120 into individual chip package structures 2100, in accordance with some embodiments. For the sake of simplicity, FIG. 8D only shows one of the chip package structures 2100, in accordance with some embodiments. In the chip package structure 2100, sidewalls of the buffer layer 1130, the molding layers 1160 and 1190, and the redistribution structure 120 are coplanar, in accordance with some embodiments.

Figure 8E:
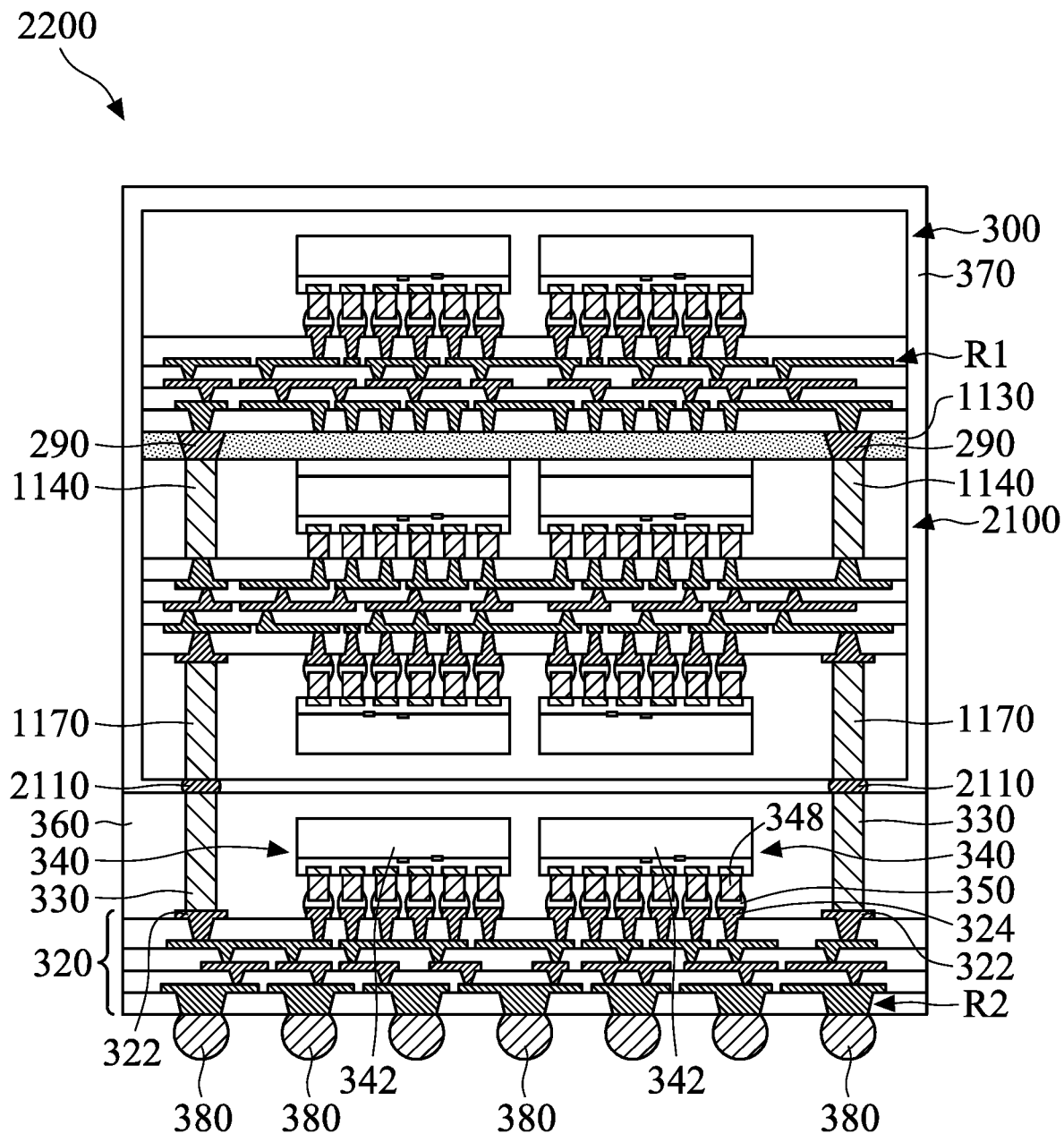

As shown in FIG. 8E, a redistribution structure 320, conductive pillars 330, chips 340, conductive bumps 350, and a molding layer 360 are formed, in accordance with some embodiments. The structures, the materials, and the arrangement of the redistribution structure 320, the conductive pillars 330, the chips 340, the conductive bumps 350, and the molding layer 360 are the same as that of FIG. 1K, in accordance with some embodiments.

As shown in FIG. 8E, the chip package structures 2100 are bonded to the conductive pillars 330 through the conductive bumps 2110, in accordance with some embodiments. The conductive bumps 2110 are between the conductive pillars 1170 and 330, in accordance with some embodiments. The conductive pillars 1170 are electrically connected to the conductive pillars 330 through the conductive bumps 2110, in accordance with some embodiments.

As shown in FIG. 8E, the chip package structures 300 are bonded to the conductive pillars 1140 through the conductive bumps 290, in accordance with some embodiments. The conductive bumps 290 are between the conductive pillars 1140 and the wiring structure R1, in accordance with some embodiments. The conductive pillars 1140 are electrically connected to the wiring structure R1 through the conductive bumps 290, in accordance with some embodiments.

As shown in FIG. 8E, a molding layer 370 is formed over the molding layer 360 to cover and surround the chip package structures 2100 and 300 and the conductive bumps 2110 and 290, in accordance with some embodiments. The molding layer 370 is made of a polymer material or another suitable insulating material. The molding layer 370 is in direct contact with the chip package structures 2100 and 300 and the conductive bumps 2110 and 290, in accordance with some embodiments.

As shown in FIG. 8E, conductive bumps 380 are formed to be connected to the wiring structure R2, in accordance with some embodiments. The conductive bumps 380 are physically and electrically connected to the wiring structure R2, in accordance with some embodiments. The conductive bumps 380 are made of a solder material, such as Sn and Ag or another suitable conductive material, in accordance with some embodiments. In some embodiments, the conductive bumps 380 are solder balls.

As shown in FIG. 8E, a dicing process is performed to cut the molding layers 360 and 370 and the redistribution structure 320 into individual chip package structures 2200, in accordance with some embodiments. For the sake of simplicity, FIG. 8E only shows one of the chip package structures 2200, in accordance with some embodiments.

Each of the chip package structures 2200 includes the chip package structures 2100 and 300, the redistribution structure 320, the chips 340, the conductive bumps 2110, 290, 350, and 380, the molding layers 360 and 370, and the conductive pillars 330, in accordance with some embodiments.

Figure 9:
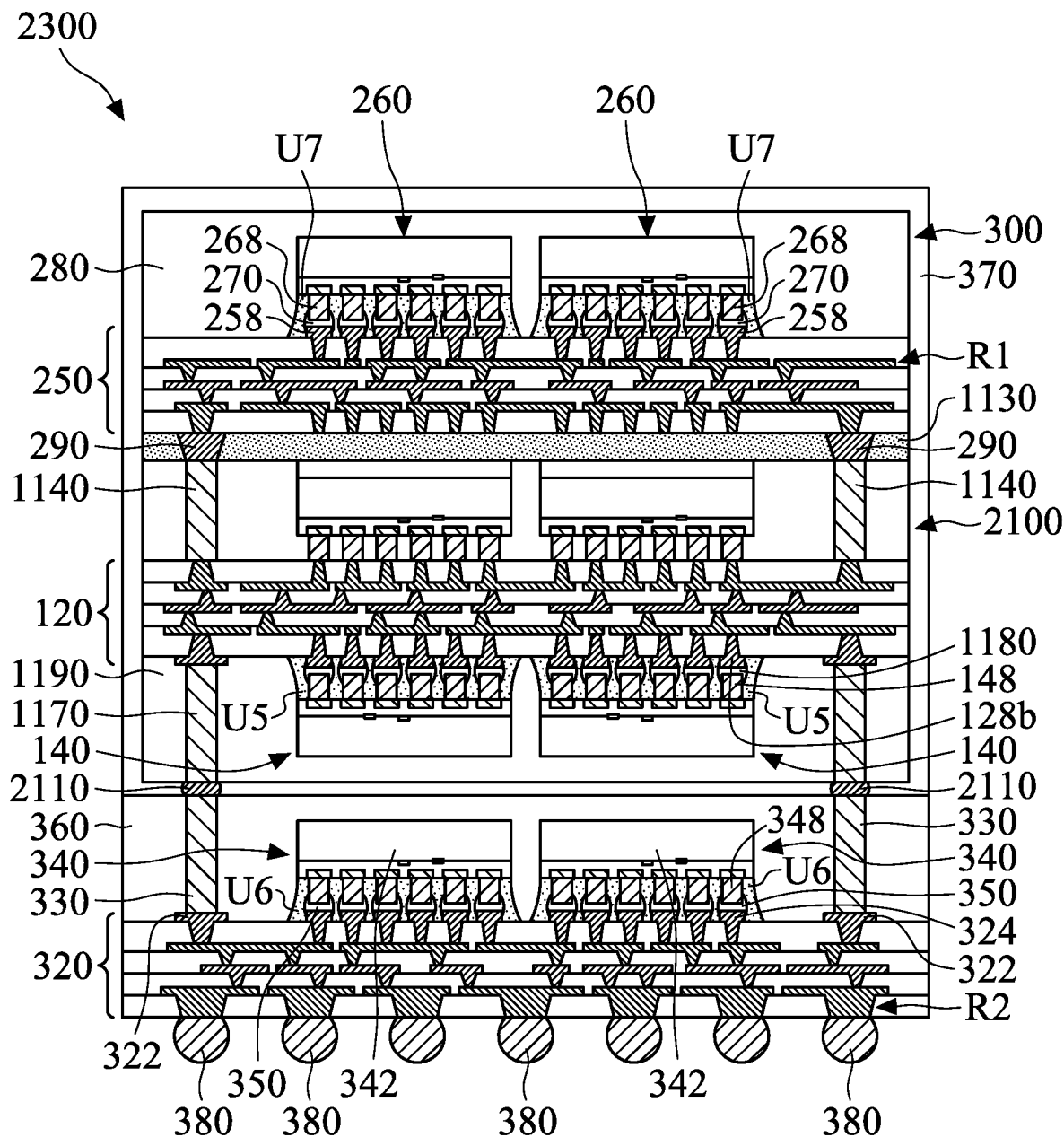
FIG. 9 is a cross-sectional view of a chip package structure, in accordance with some embodiments.

FIG. 9 is a cross-sectional view of a chip package structure, in accordance with some embodiments. As shown in FIG. 9, a chip package structure 2300 is similar to the chip package structure 2200 of FIG. 8E, except that the chip package structure 2300 further includes underfill layers U5, U6, and U7, in accordance with some embodiments.

The underfill layers U5 are formed between the chips 140 and the redistribution structure 120 before the formation of the molding layer 1190, in accordance with some embodiments. The underfill layer U5 surrounds the conductive bumps 1180, the conductive structures 148, and the conductive pads 128*b*, in accordance with some embodiments.

The underfill layer U5 is in direct contact with the conductive bumps 1180, the conductive structures 148, and the conductive pads 128*b*, in accordance with some embodiments. The underfill layer U5 includes an insulating material (e.g., a polymer material), in accordance with some embodiments.

The underfill layers U6 are formed between the chips 340 and the redistribution structure 320 before the formation of the molding layer 360, in accordance with some embodiments. The underfill layer U6 surrounds the conductive bumps 350, the conductive structures 348, and the conductive pads 324, in accordance with some embodiments.

The underfill layer U6 is in direct contact with the conductive bumps 350, the conductive structures 348, and the conductive pads 324, in accordance with some embodiments. The underfill layer U6 includes an insulating material (e.g., a polymer material), in accordance with some embodiments.

The underfill layers U7 are formed between the chips 260 and the redistribution structure 250 before the formation of the molding layer 280, in accordance with some embodiments. The underfill layer U7 surrounds the conductive bumps 270, the conductive structures 268, and the conductive pads 258, in accordance with some embodiments.

The underfill layer U7 is in direct contact with the conductive bumps 270, the conductive structures 268, and the conductive pads 258, in accordance with some embodiments. The underfill layer U7 includes an insulating material (e.g., a polymer material), in accordance with some embodiments. The materials of the underfill layers U5, U6, and U7 are different from the materials of the molding layers 1190, 360, and 280, in accordance with some embodiments.

Figure 10:
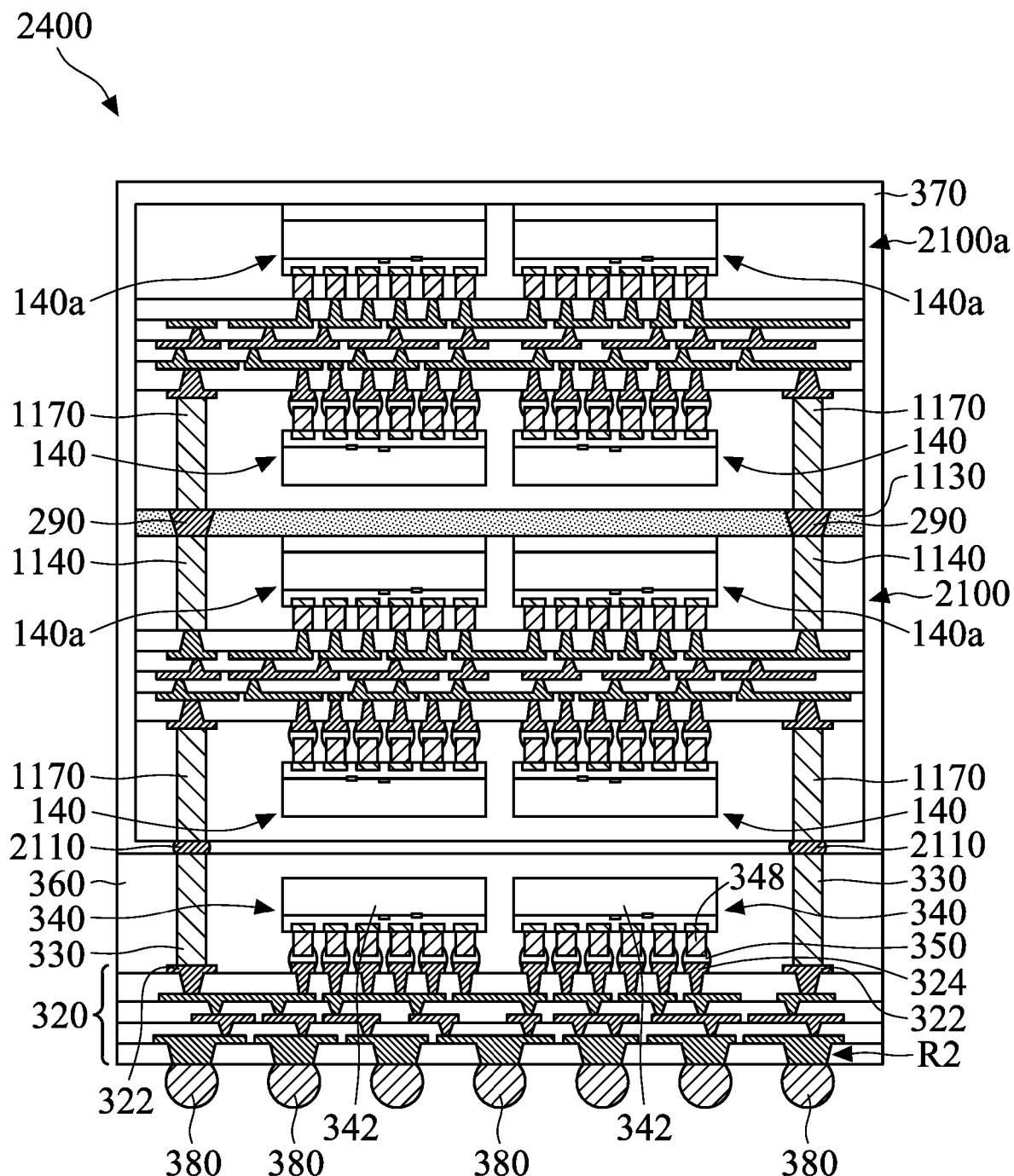
FIG. 10 is a cross-sectional view of a chip package structure, in accordance with some embodiments.

FIG. 10 is a cross-sectional view of a chip package structure, in accordance with some embodiments. As shown in FIG. 10, a chip package structure 2400 is similar to the chip package structure 2200 of FIG. 8E, except that the chip package structure 2400 further includes a chip package structure 2100a and does not include the chip package structure 300, in accordance with some embodiments.

The chip package structure 2100a is similar to the chip package structure 2100, except that the chip package structure 2100a does not include the conductive pillars 1140, in accordance with some embodiments. The conductive bumps 290 are between the conductive pillars 1170 of the chip package structure 2100a and the conductive pillars 1140, in accordance with some embodiments. The conductive pillars 1170 of the chip package structure 2100a are electrically connected to the conductive pillars 1140 through the conductive bumps 290, in accordance with some embodiments.

Figure 11:
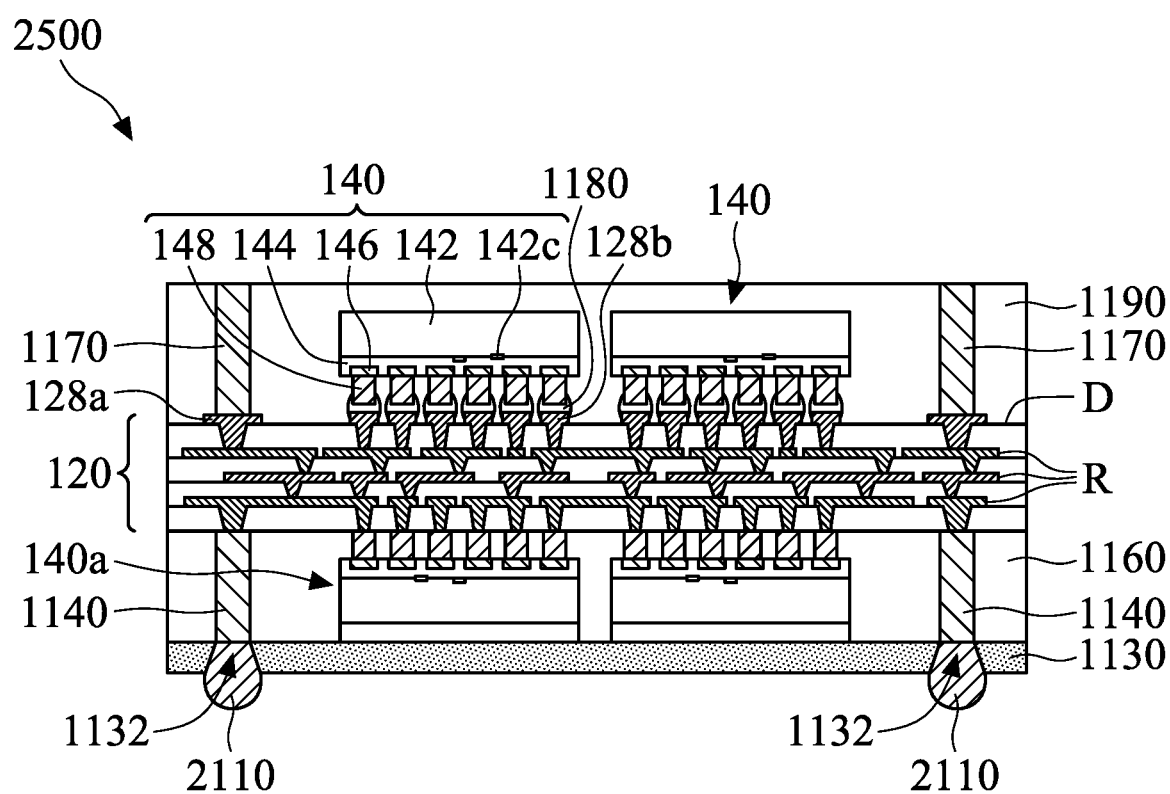
FIG. 11 is a cross-sectional view of a chip package structure, in accordance with some embodiments.

FIG. 11 is a cross-sectional view of a chip package structure, in accordance with some embodiments. After the step of FIG. 8C, as shown in FIG. 11, the carrier substrate 1110 and the adhesive layer 1120 are removed, in accordance with some embodiments. As shown in FIG. 11, a portion of the buffer layer 1130 is removed to form openings 1132 in the buffer layer 1130, in accordance with some embodiments. The openings 1132 expose the conductive pillars 1140, in accordance with some embodiments.

As shown in FIG. 11, conductive bumps 2110 are formed in the openings 1132, in accordance with some embodiments. The conductive bumps 2110 are electrically connected to the conductive pillars 1140, in accordance with some embodiments. The conductive bumps 2110 are made of a solder material, such as Sn and Ag or another suitable conductive material, in accordance with some embodiments.

As shown in FIG. 11, a dicing process is performed to cut the buffer layer 1130, the molding layers 1160 and 1190, and the redistribution structure 120 into individual chip package structures 2500, in accordance with some embodiments. For the sake of simplicity, FIG. 11 only shows one of the chip package structures 2500, in accordance with some embodiments. In the chip package structure 2500, sidewalls of the buffer layer 1130, the molding layers 1160 and 1190, and the redistribution structure 120 are coplanar, in accordance with some embodiments. In some embodiments, the conductive pillars 1170 are not formed.

Figure 12A:
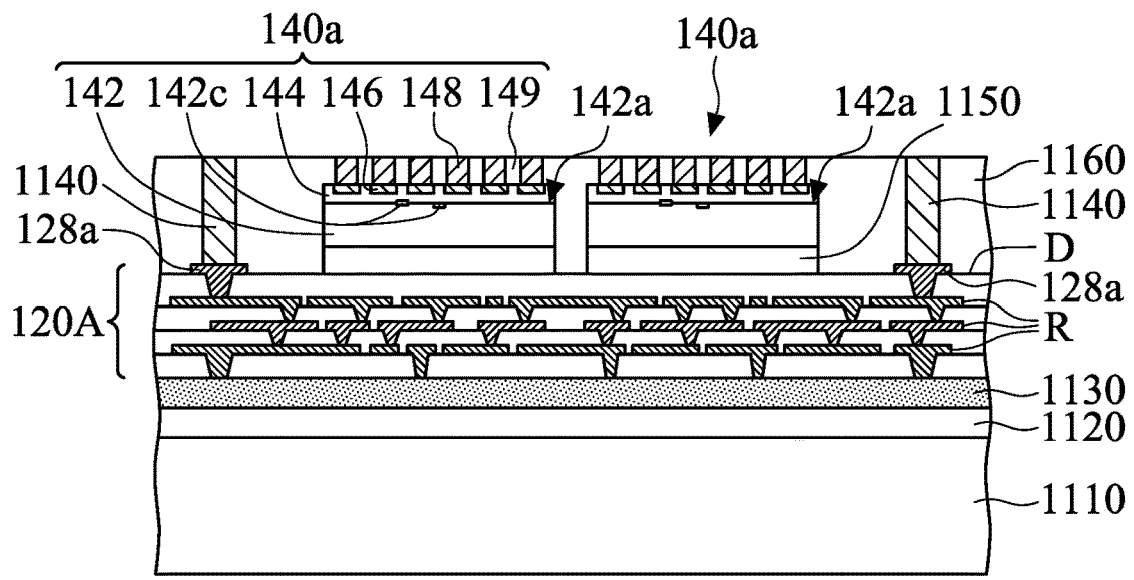
FIGS. 12A-12B are cross-sectional views of various stages of a process for forming a chip package structure, in accordance with some embodiments.
Figure 12B:
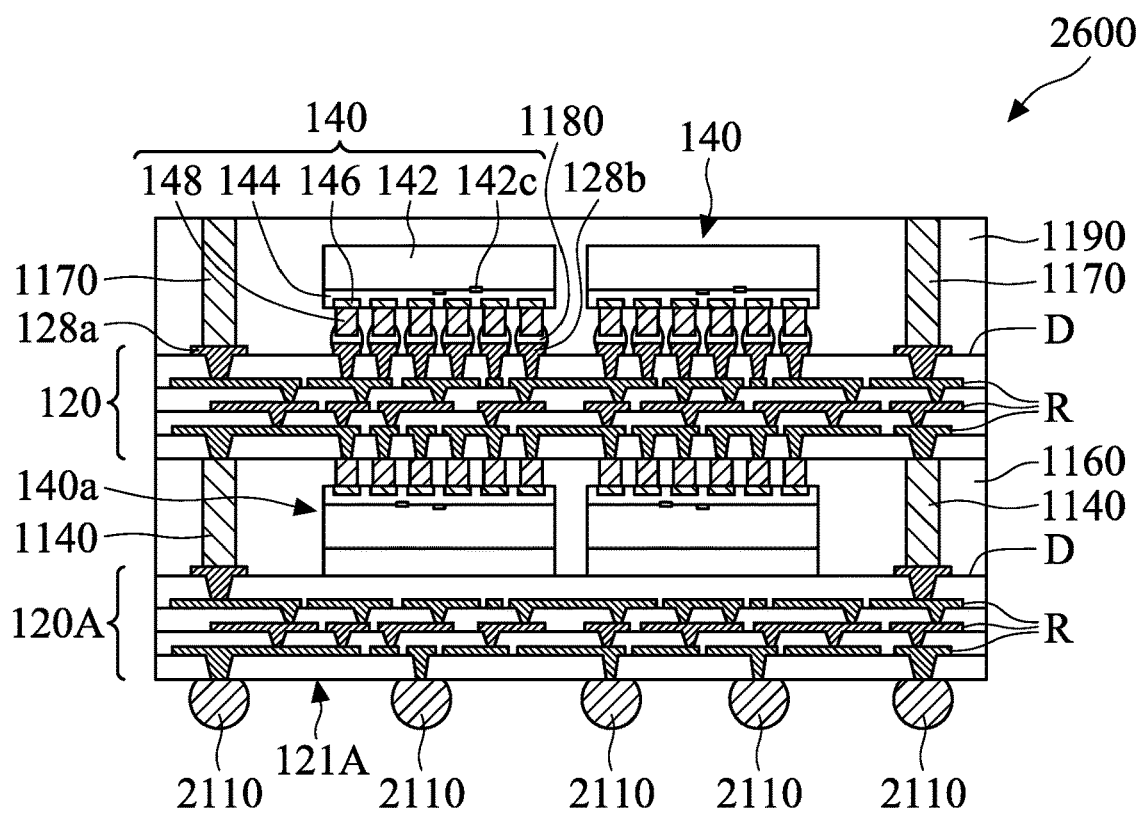

FIGS. 12A-12B are cross-sectional views of various stages of a process for forming a chip package structure, in accordance with some embodiments. The step of FIG. 12A is similar to FIG. 8A, except that the step of FIG. 12A further includes forming a redistribution structure 120A over the buffer layer 1130 before the formation of the conductive pillars 1140 and the chips 140a, in accordance with some embodiments.

The redistribution structure 120A is similar to the redistribution structure 120 of FIG. 1A, in accordance with some embodiments. The redistribution structure 120A includes a dielectric structure D, a wiring structure R, and conductive pads 128a, in accordance with some embodiments.

The wiring structure R is formed in the dielectric structure D, in accordance with some embodiments. The conductive pads 128a are formed over the dielectric structure D and extend into the dielectric structure D to be electrically connected to the wiring structure R, in accordance with some embodiments.

As shown in FIG. 12A, conductive pillars 1140 are formed over the conductive pads 128a, in accordance with some embodiments. As shown in FIG. 12A, chips 140a are bonded to the dielectric structure D through an adhesive layer 1150, in accordance with some embodiments. As shown in FIG. 12A, a molding layer 1160 is formed over the redistribution structure 120A to surround the chips 140a and the conductive pillars 1140, in accordance with some embodiments.

As shown in FIG. 12B, the steps of FIGS. 8B-8C are performed, in accordance with some embodiments. As shown in FIG. 12B, the carrier substrate 1110, the adhesive layer 1120, and the buffer layer 1130 are removed, in accordance with some embodiments.

As shown in FIG. 12B, conductive bumps 2110 are formed over a bottom surface 121A of the redistribution structure 120A, in accordance with some embodiments. The conductive bumps 2110 are electrically connected to the wiring structure R, in accordance with some embodiments.

As shown in FIG. 12B, a dicing process is performed to cut the molding layers 1160 and 1190 and the redistribution structures 120 and 120A into individual chip package structures 2600, in accordance with some embodiments. For the sake of simplicity, FIG. 12B only shows one of the chip package structures 2600, in accordance with some embodiments. In the chip package structure 2600, sidewalls of the molding layers 1160 and 1190 and the redistribution structures 120 and 120A are coplanar, in accordance with some embodiments. In some embodiments, the conductive pillars 1170 are not formed.

Figure 13A:
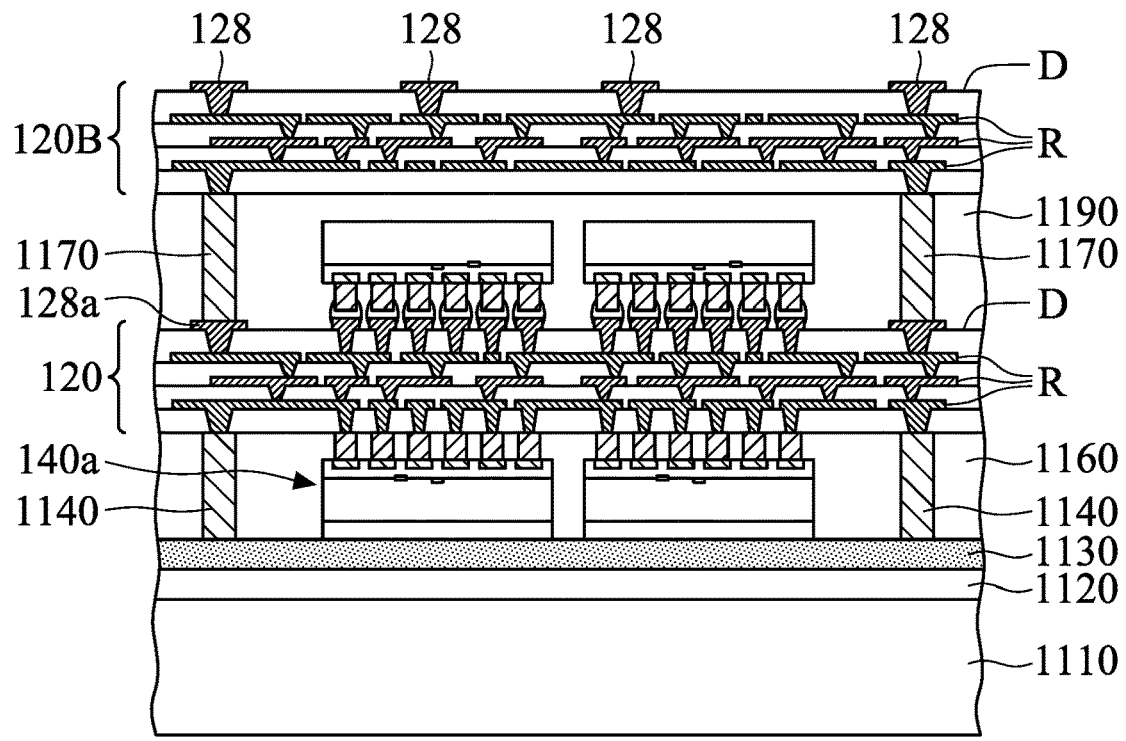
FIGS. 13A-13B are cross-sectional views of various stages of a process for forming a chip package structure, in accordance with some embodiments.
Figure 13B:
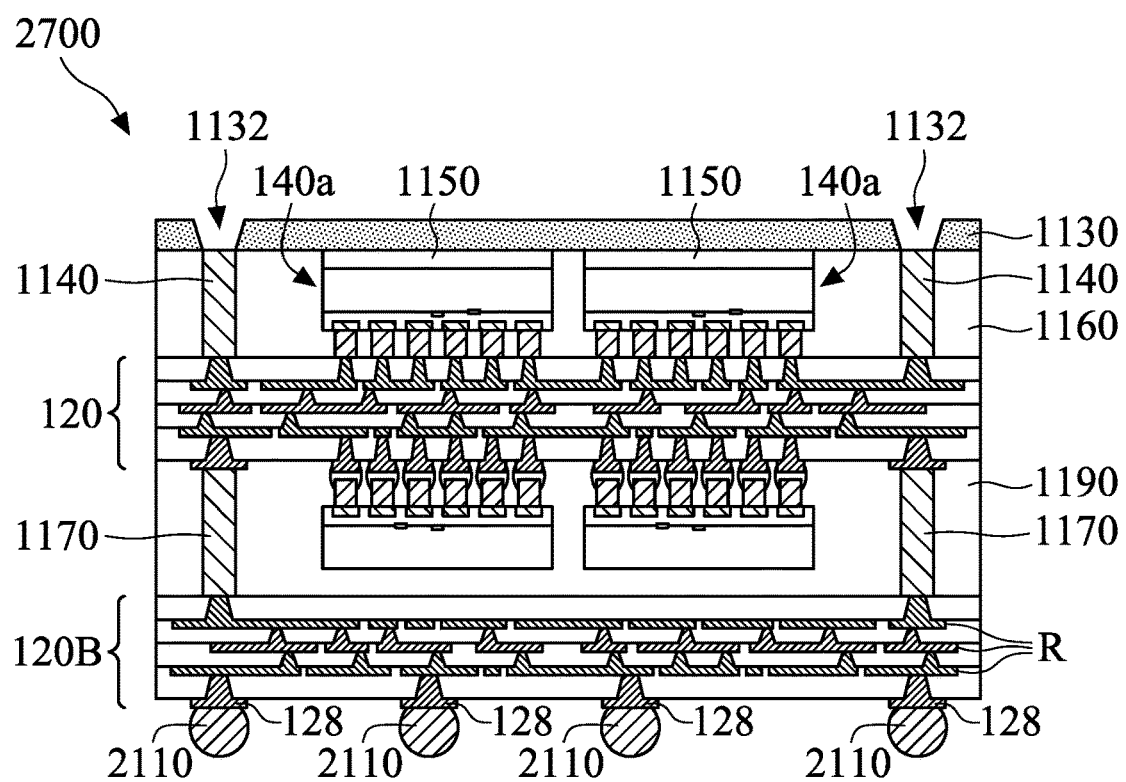

FIGS. 13A-13B are cross-sectional views of various stages of a process for forming a chip package structure, in accordance with some embodiments. After the step of FIG. 8C, as shown in FIG. 13A, a redistribution structure 120B is formed over the molding layer 1190 and the conductive pillars 1170, in accordance with some embodiments.

The redistribution structure 120B is similar to the redistribution structure 120 of FIG. 1A, in accordance with some embodiments. The redistribution structure 120B includes a dielectric structure D, a wiring structure R, and conductive pads 128, in accordance with some embodiments.

The wiring structure R is formed in the dielectric structure D, in accordance with some embodiments. The conductive pads 128 are formed over the dielectric structure D and extend into the dielectric structure D to be electrically connected to the wiring structure R, in accordance with some embodiments.

As shown in FIG. 13B, conductive bumps 2110 are formed over the conductive pads 128 to be electrically connected to the conductive pads 128, in accordance with some embodiments. As shown in FIG. 13B, the carrier substrate 1110 and the adhesive layer 1120 are removed, in accordance with some embodiments.

As shown in FIG. 13B, the redistribution structure 120 is flipped upside down, in accordance with some embodiments. As shown in FIG. 13B, a portion of the buffer layer 1130 is removed to form openings 1132 in the buffer layer 1130, in accordance with some embodiments. The openings 1132 expose the conductive pillars 1140, in accordance with some embodiments.

As shown in FIG. 13B, a dicing process is performed to cut the buffer layer 1130, the molding layers 1160 and 1190, and the redistribution structures 120 and 120B into individual chip package structures 2700, in accordance with some embodiments. For the sake of simplicity, FIG. 13B only shows one of the chip package structures 2700, in accordance with some embodiments. In the chip package structure 2700, sidewalls of the buffer layer 1130, the molding layers 1160 and 1190, and the redistribution structures 120 and 120B are coplanar, in accordance with some embodiments.

Figure 14:
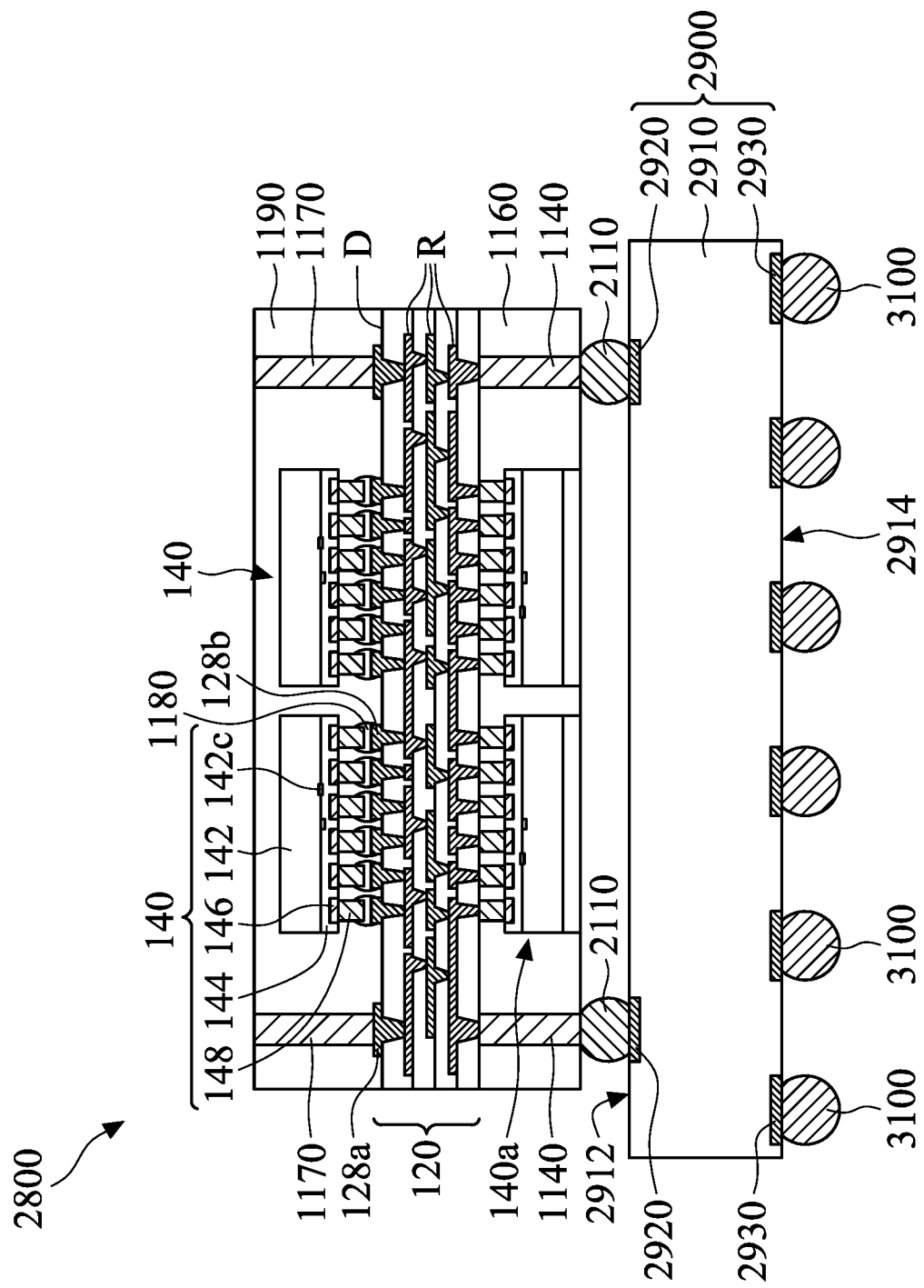
FIG. 14 is a cross-sectional view of a chip package structure, in accordance with some embodiments.

FIG. 14 is a cross-sectional view of a chip package structure 2800, in accordance with some embodiments. As shown in FIG. 14, the chip package structure 2800 is similar to the chip package structure 2500 of FIG. 11, except that the chip package structure 2800 does not include the buffer layer 1130, in accordance with some embodiments.

The chip package structures 2500, 2600, 2700, and 2800 of FIGS. 11, 12B, 13B, and 14 may be applied in the chip package structures 2200, 2300, and 2400 of FIGS. 8E, 9, and 10. For example, the chip package structure 2100 of the chip package structure 2200, 2300, or 2400 may be replaced with the chip package structure 2500, 2600, 2700, or 2800, according to design requirements.

As shown in FIG. 14, the chip package structure 2800 is bonded to a substrate 2900 through the conductive bumps 2110, in accordance with some embodiments. The substrate 2900 includes a base portion 2910, first bonding pads 2920, and second bonding pads 2930, in accordance with some embodiments. The base portion 2910 has opposite two sides 2912 and 2914, in accordance with some embodiments.

The first bonding pads 2920 and the second bonding pads 2930 are respectively positioned on the two sides 2912 and 2914, in accordance with some embodiments. The conductive pillars 1140 are respectively and electrically connected to the first bonding pads 2920 through the conductive bumps 2110, in accordance with some embodiments.

The base portion 2910 includes wiring layers and dielectric layers, in accordance with some embodiments. The first bonding pads 2920 are electrically connected to the second bonding pads 2930 through the wiring layers of the base portion 2910, in accordance with some embodiments.

In some other embodiments, the base portion 2910 includes a semiconductor substrate and through vias (e.g., through silicon vias) passing through the semiconductor substrate. The first bonding pads 2920 are electrically connected to the second bonding pads 2930 through the through vias of the base portion 2910, in accordance with some embodiments.

As shown in FIG. 14, conductive bumps 3100 are formed over the second bonding pads 2930, in accordance with some embodiments. The conductive bumps 3100 are electrically connected to the second bonding pads 2930, in accordance with some embodiments.

The chip package structure 200, 200a, 300, 400, 500, 600, 700, 800, 900, 1000, 2100, 2200, 2300, 2400, 2500, 2600, or 2700 of FIG. 1H, 7, 1J, 1M, 2-7, 8D, 8E, 9-11, 12B, or 13B may be bonded to the substrate 2900 through conductive bumps.

In accordance with some embodiments, chip package structures and methods for forming the same are provided. The methods (for forming the chip package structures) form a first chip and a second chip over two opposite surfaces of a redistribution structure, respectively. A first front surface of the first chip and a second front surface of the second chip face to each other. Therefore, the conductive path between electronic elements formed over the first front surface and electronic elements formed over the second front surface is reduced. Therefore, the signal transmission speed between the electronic elements formed over the first and the second front surfaces is improved. As a result, the performance of the chip package structure is improved.

In accordance with some embodiments, a chip package structure is provided. The chip package structure includes a first redistribution structure having a first surface and a second surface opposite to the first surface. The chip package structure includes a first chip over the first surface. The chip package structure includes a first conductive pillar over the first surface and adjacent to the first chip. The chip package structure includes a second chip over the second surface. The chip package structure includes a second conductive pillar over the second surface and adjacent to the second chip. The chip package structure includes a first molding layer over the first surface and surrounding the first chip. The first conductive pillar passes through the first molding layer, a first portion of the first molding layer covers a first bottom surface of the first chip, and the first bottom surface faces away from the first redistribution structure. The chip package structure includes a second molding layer over the second surface and surrounding the second chip. The second conductive pillar passes through the second molding layer, a second portion of the second molding layer covers a first top surface of the second chip, the first top surface faces away from the first redistribution structure. The first chip, the first redistribution structure, and the second chip are between the first portion of the first molding layer and the second portion of the second molding layer.

In accordance with some embodiments, a chip package structure is provided. The chip package structure includes a redistribution structure having a first surface and a second surface opposite to the first surface. The chip package structure includes a first chip over the first surface. The chip package structure includes an interposer over the first surface. The interposer includes a substrate and a conductive structure passing through the substrate. The chip package structure includes a first molding layer over the first surface and surrounding the first chip and the interposer. The chip package structure includes a second chip over the second surface. The chip package structure includes a conductive bump connected between the interposer and the redistribution structure.

In accordance with some embodiments, a chip package structure is provided. The chip package structure includes a redistribution structure having a first surface and a second surface opposite to the first surface. The chip package structure includes a first chip over the first surface. The chip package structure includes a first conductive pillar over the first surface. The chip package structure includes a second chip over the second surface. The chip package structure includes a second conductive pillar over the second surface. The chip package structure includes a first molding layer over the first surface and surrounding the first chip. The first conductive pillar passes through the first molding layer, a first portion of the first molding layer is between the first chip and the redistribution structure and in contact with a third surface of the first chip, and the third surface faces the redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a first redistribution structure having a first surface and a second surface opposite to the first surface;
a first chip over the first surface;
a first conductive pillar over the first surface and adjacent to the first chip;
a second chip over the second surface;
a second conductive pillar over the second surface and adjacent to the second chip;
a first molding layer over the first surface and surrounding the first chip, wherein the first conductive pillar passes through the first molding layer, a first portion of the first molding layer covers a first bottom surface of the first chip, and the first bottom surface faces away from the first redistribution structure;
a second molding layer over the second surface and surrounding the second chip, wherein the second conductive pillar passes through the second molding layer, a second portion of the second molding layer covers a first top surface of the second chip, the first top surface faces away from the first redistribution structure, and the first chip, the first redistribution structure, and the second chip are between the first portion of the first molding layer and the second portion of the second molding layer;
a second redistribution structure over the second chip;
a buffer layer between the second redistribution structure and the second chip;
a third chip over the second redistribution structure, wherein the second redistribution structure is between the third chip and the buffer layer; and
a conductive bump passing through the buffer layer and connected between the second conductive pillar and the second redistribution structure, wherein a width of the conductive bump continuously decreases from the second redistribution structure to the second conductive pillar.

2. The chip package structure as claimed in claim 1, wherein a second bottom surface of the first molding layer is substantially level with a third bottom surface of the first conductive pillar.

3. The chip package structure as claimed in claim 2, wherein a second top surface of the second molding layer is substantially level with a third top surface of the second conductive pillar.

4. The chip package structure as claimed in claim 3, wherein the second bottom surface of the first molding layer is lower than the first bottom surface of the first chip.

5. The chip package structure as claimed in claim 4, wherein the second top surface of the second molding layer is higher than the first top surface of the second chip.

6. The chip package structure as claimed in claim 5, wherein a third portion of the first molding layer is between the first chip and the first redistribution structure, and a fourth portion of the second molding layer is between the second chip and the first redistribution structure.

7. The chip package structure as claimed in claim 1, wherein the first conductive pillar and the second conductive pillar are arranged in a straight line, and the straight line is perpendicular to the first surface of the first redistribution structure.

8. The chip package structure as claimed in claim 1, wherein the conductive bump has a trapezoid shape.

9. The chip package structure as claimed in claim 1, wherein the second redistribution structure comprises a dielectric layer and a wiring layer, the wiring layer is over the dielectric layer, a portion of the wiring layer passes through the dielectric layer, and the conductive bump is in contact with the dielectric layer and the portion of the wiring layer.

10. A chip package structure, comprising:
a redistribution structure having a first surface and a second surface opposite to the first surface;
a first chip over the first surface;
a first conductive pillar over the first surface;
a second chip over the second surface;
a second conductive pillar over the second surface;
a first molding layer over the first surface and surrounding the first chip, wherein the first conductive pillar passes through the first molding layer, a first portion of the first molding layer is between the first chip and the redistribution structure and in contact with a third surface of the first chip, and the third surface faces the redistribution structure;
an adhesive layer over the second chip, wherein the second chip is between the adhesive layer and the redistribution structure; and
a second molding layer over the second surface and surrounding the second chip, the adhesive layer and the second conductive pillar, wherein the adhesive layer is embedded in the second molding layer.

11. The chip package structure as claimed in claim 10, wherein a first top surface of the second molding layer, a second top surface of the adhesive layer, and a third top surface of the second conductive pillar are substantially level with each other.

12. A chip package structure, comprising:
a redistribution structure having a first surface and a second surface opposite to the first surface;
a first chip over the first surface;
an interposer over the first surface, wherein the interposer comprises a substrate and a conductive structure passing through the substrate;
a first molding layer over the first surface and surrounding the first chip and the interposer, wherein a portion of the first molding layer is between the redistribution structure and the interposer and separates the redistribution structure from the interposer;
a second chip over the second surface; and
a conductive bump passing through the portion of the first molding layer and connected between the interposer and the redistribution structure.

13. The chip package structure as claimed in claim 12, wherein a first bottom surface of the first molding layer and a second bottom surface of the interposer are substantially level with each other.

14. The chip package structure as claimed in claim 13, wherein the first bottom surface of the first molding layer, a third bottom surface of the substrate, and a fourth bottom surface of the conductive structure are substantially level with each other.

15. The chip package structure as claimed in claim 12, further comprising:
a second molding layer over the second surface and surrounding the second chip.

16. The chip package structure as claimed in claim 15, wherein a first sidewall of the first molding layer and a second sidewall of the second molding layer are substantially coplanar.

17. The chip package structure as claimed in claim 12, wherein the interposer further comprises a wiring structure between the conductive structure and the redistribution structure, and the wiring structure is electrically connected to the redistribution structure and the conductive structure.

18. The chip package structure as claimed in claim 10, wherein a first sidewall of the adhesive layer is connected to a second sidewall of the second chip, and the first sidewall and the second sidewall face the second conductive pillar.

19. The chip package structure as claimed in claim 10, wherein a first top surface of the second molding layer and a second top surface of the adhesive layer are substantially level with each other.

20. The chip package structure as claimed in claim 10, wherein the second conductive pillar passes through the second molding layer, a second portion of the second molding layer is between the second chip and the redistribution structure and in contact with a fourth surface of the second chip, and the fourth surface faces the redistribution structure.

* * * * *